(12) United States Patent
Voicu et al.

(10) Patent No.: US 7,012,555 B2
(45) Date of Patent: *Mar. 14, 2006

(54) DIGITAL POTENTIOMETER INCLUDING AT LEAST ONE BULK IMPEDANCE DEVICE

(75) Inventors: Gelu Voicu, San Jose, CA (US); Radu H. Iacob, Santa Clara, CA (US); Otilia Neagoe, Bucharest (RO)

(73) Assignee: Catalyst Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/660,232

(22) Filed: Sep. 10, 2003

(65) Prior Publication Data

US 2005/0052306 A1 Mar. 10, 2005

(51) Int. Cl.
*H03M 1/778* (2006.01)
*H03M 1/60* (2006.01)

(52) U.S. Cl. ..................... 341/154; 341/144
(58) Field of Classification Search .............. 341/154, 341/144; 323/369, 298, 297; 327/519
See application file for complete search history.

(56) References Cited

U.S. PATENT DOCUMENTS

| | | | |
|---|---|---|---|
| 4,271,486 A | | 6/1981 | Dagostino et al. |
| 4,468,607 A | | 8/1984 | Tanaka et al. |
| 4,477,920 A | | 10/1984 | Nygaard, Jr. |
| 4,668,932 A | | 5/1987 | Drori et al. |
| 5,084,667 A | | 1/1992 | Drori et al. |
| 5,297,056 A | | 3/1994 | Lee et al. |
| 5,495,245 A | | 2/1996 | Ashe |
| 5,717,323 A | * | 2/1998 | Tailliet .................. 323/297 |
| 6,201,491 B1 | * | 3/2001 | Brunolli et al. ............ 341/144 |
| 6,320,451 B1 | * | 11/2001 | Harvey et al. ............ 327/519 |
| 6,331,768 B1 | | 12/2001 | Drori et al. |
| 6,555,996 B1 | * | 4/2003 | Drori et al. .............. 323/369 |
| 2004/0108844 A1 | * | 6/2004 | Stanescu et al. ........... 323/298 |

OTHER PUBLICATIONS

Catalyst Semiconductor, Inc., "CAT515: 8-Bit Quad DACpot with RDY/BUSY and IND. Reference Inputs," 1997, pp. 1-11, no month.
Catalyst Semiconductor, Inc., "CAT524: 8-Bit Quad Digital POT," 1998, pp. 25-36, no month.

(Continued)

*Primary Examiner*—Peguy Jeanpierre
*Assistant Examiner*—Lam T. Mai
(74) *Attorney, Agent, or Firm*—Bever, Hoffman & Harms, LLP; E. Eric Hoffman

(57) ABSTRACT

Embodiments of a digital potentiometer are disclosed that require lesser numbers of components than conventional digital potentiometers. A first string of elemental impedance devices, and at least one bulk impedance device, are provided between first and second reference terminals. The first string of elemental impedance devices is tapped by wiper switches. The at least one bulk impedance device has an impedance greater than an impedance of the first string. If desired, second and third bypassable impedance device strings also may be provided between the first and second reference terminals, with the impedance of the respective second and third strings being between the impedance of the first string and the impedance of one bulk impedance device. One or more dummy structures each including an impedance device in parallel with a permanently-on switch also may be between the first and second reference terminals to improve linearity.

36 Claims, 7 Drawing Sheets

OTHER PUBLICATIONS

Catalyst Semiconductor, Inc., "CAT514: 8-Bit Quad DACpot," 1997, pp. 1-13, no month.

Catalyst Semiconductor, Inc., "CAT514: 8-Bit Quad Digital POT," 1999, pp. 1-12, no month.

Catalyst Semiconductor, Inc., "CAT525: 8-Bit Quad Digital POT With Independent Reference Inputs," 1999, pp. 1-11, no month.

Catalyst Semiconductor, Inc., "CAT5111, CAT5112, CAT5113 and CAT5114: 100/32-Tap Digital POT with Independent Reference Inputs," 1999, pp. 1-6, no month.

Stanescu et al., "32 Taps Digitally Controlled Buffered Potentiometer," Proceedings of CAS 2001 International Semiconductor Conference, IEEE Catalog No. 01TH8547, pp. 535-538, Oct. 2001.

* cited by examiner

DIGITAL POTENTIOMETER INCLUDING AT LEAST ONE BULK IMPEDANCE DEVICE

BACKGROUND a. Technical Field

The present invention is in the field of digital potentiometers.

b. Discussion of the Related Art

Digital potentiometers are electronic circuits that can provide a variable impedance as a result of processing a digital sequence. A digital potentiometer has a fixed-value impedance connected between two reference terminals. This impedance is provided by a string of impedance devices that can be selectively connected to a third terminal, called the wiper terminal herein, through electronic switches controlled by digital signals. Digital potentiometers can be used in digital to analog converters, and as replacements for mechanical potentiometers and rheostats.

The fineness of adjustment, resolution, or "granularity" of a digital potentiometer is typically determined by the number of digital bits used for the selection of the desired wiper position. For instance, an eight bit wiper address allows for $2^8$ (i.e., 256) different wiper impedance selections, i.e., wiper positions. A disadvantage of finer adjustment granularity (more digital bits) is a rapid increase in the number of components (e.g., resistors, switches, decoding gates and other logic devices) required for implementation. The increase in the number of components typically results in larger and more expensive devices.

FIG. 1 is a schematic diagram of a digital potentiometer 100 that operates on the voltage-scaling principle. A resistor string including series-connected resistors $R_0, R_1, \ldots R_{2^n-2}$ is connected between a high reference voltage ($V_{REF+}$) terminal 102 and a low reference voltage ($V_{REF-}$) terminal 104. The voltage drop across one of the resistors is equal to one least significant bit (LSB) of output voltage $V_w$ change. The output analog signal $V_w$ is collected on wiper terminal 106.

The wiper position is set by a switch decoding network, illustrated by decoder 108 and wiper switches $S_0, S_1, \ldots S_{2^n-1}$. The wiper switches are typically implemented as one or more transistors. Decoder 108 receives input signals on line 110 and controls the operation of the wiper switches. The wiper switches tap different points in the resistor string, so that closing a particular wiper switch while leaving the other wiper switches open provides a unique ratio between the resistance values of the two resistor sub-chains connected to wiper terminal 106 via the closed wiper switch.

As mentioned, one disadvantage of this type of digital potentiometer is the relatively large number of components required. In particular, for n-bit resolution, digital potentiometer 100 requires $2^n-1$ resistors and $2^n$ wiper switches. For example, in an eight bit implementation where digital potentiometer 100 includes 256 wiper positions, this approach would use 255 resistors and 256 wiper switches. In general, it is desirable to significantly reduce this large number of components for purposes of area savings, higher manufacturing yields, and lower costs. It is also desirable to reduce the number of transistor junctions connected at the terminals of each resistor element of the string of resistors. The parasitic electrical capacitance of each transistor junction used for the implementation of the analog switches between individual resistors adds to the distributed capacitance of the string of resistors and, thus, affects the AC frequency performance of the string of impedances. These transistors may also have leakage currents increasing with temperature, causing a temperature dependent variation of the current through the resistors greater than the variation of current expected due to the temperature coefficient of the resistors of the resistor string.

SUMMARY

The present invention includes a digital potentiometer that may be implemented using significantly fewer impedance devices and wiper switches than are used in conventional digital potentiometer 100 of FIG. 1, while providing the same resolution, i.e., same number of wiper positions.

A first embodiment of the invention includes an n-bit digital potentiometer having a range of $2^n$ wiper positions. A string of $2^{n-1}-1$ elemental impedance devices is disposed between a first reference terminal and a second reference terminal. A set of $2^{n-1}$ wiper switches is provided to tap the string of elemental impedance devices, with only one of the wiper switches being turned on at the completion of any given switching sequence. A bulk impedance device having an impedance value that is $2^{n-1}$ times that of one of the elemental impedance devices i.e., one elemental impedance value greater than the impedance of the first string, is selectively coupled between the impedance device string and either the first reference terminal or the second reference terminal, depending on whether an input wiper address is in the lower half or the upper half of the $2^n$ wiper address range of the digital potentiometer. Through use of the bulk impedance device, the digital potentiometer provides a range of $2^n$ wiper address, but requires only $2^{n-1}-1$ elemental impedance devices, $2^{n-1}$ wiper switches, one bulk impedance device having an impedance of $2^{n-1}$ times one of the elemental impedance devices, and two switching devices to change the coupling of the bulk impedance device back and forth between the first and second reference terminals. This amounts to a significant reduction, approximately 50%, in the number of impedance devices and switches in comparison to the conventional digital potentiometer of FIG. 1.

A second embodiment of the present invention includes an n-bit digital potentiometer that likewise includes a string of $2^{n-1}-1$ elemental impedance devices and a set of $2^{n-1}$ wiper switches. However, instead of having only one bulk impedance device, as with the first embodiment, the second embodiment includes a pair of same-impedance bulk impedance devices disposed between the first and second reference terminals with the string of elemental impedance devices. Each of the two bulk impedance devices has an impedance value that is $2^{n-1}$ times that of one of the elemental impedance devices. One of the bulk impedance devices of the pair is coupled between a first end of the elemental impedance device string and the first reference terminal, and the other bulk impedance device of the pair is coupled between an opposite second end of the elemental impedance device string and the second reference terminal. Two switching devices also are provided, one in parallel with each of the bulk impedance devices. The switching devices are operated in a complementary fashion, so that one of the two switching devices is on and the other is off at the completion of a switching sequence. In particular, when an input n-bit wiper address is in the lower half of the wiper address range, the bulk impedance device coupled to the first reference terminal is bypassed by its associated switching device, and the bulk impedance device coupled to the second reference terminal is not bypassed. On the other hand, when the input wiper address is at the middle of the wiper address range or higher, the bulk impedance device coupled to the second reference terminal is bypassed by its associated switching device, and the bulk impedance device coupled to the first reference terminal not bypassed. Through use of the bulk impedance devices, the digital potentiometer provides a range of $2^n$ wiper address, but requires only $2^{n-1}-1$ elemental impedance devices, $2^{n-1}$ wiper switches, two bulk impedance devices each having an impedance of $2^{n-1}$ times one of the elemental impedance devices, and two switching devices to bypass the bulk impedance devices in a complementary fashion. This amounts to a significant reduction, approximately 50%, in the number of impedance devices and switches in comparison to the conventional digital potentiometer 100 of FIG. 1.

A third exemplary embodiment of the present invention includes an n-bit digital potentiometer having some features similar to the second embodiment described above, including a string of elemental impedance devices coupled between two shunted bulk impedance devices. One of the bulk impedance devices is coupled to the first reference terminal and the other of the bulk impedance devices is coupled to the second reference terminal, and the string of elemental impedance devices is coupled between the two bulk impedance devices. In addition, however, the third embodiment includes two mirror-image strings of shunted intermediate impedance devices. The two strings are coupled with the string of elemental impedance devices and the two bulk impedance devices between the first and second reference terminals. One of the two strings is disposed between a first end of the elemental impedance device string and a first one of the two bulk impedance devices, and the other of the two strings is disposed between an opposite second end of the elemental impedance device string and the other of the two bulk impedance devices. The impedance devices of the two strings are each intermediate in impedance between the impedance of the string of elemental impedance devices and the impedance of one of the bulk impedance devices. For instance, the intermediate impedance devices each may have an impedance $2^{[n/2]}$ times the impedance of one of the elemental impedance devices, $[n/2]$ being the integer part of n/2, whereas the bulk impedance devices each may have an impedance of $2^{n-1}$ times the impedance of one of the elemental impedance devices. Each of the two strings also includes an additional building block, called a dummy structure herein, that is disposed between the first intermediate-impedance impedance device of the string and the adjacent bulk impedance device. The dummy structures are identical, and include an impedance device shunted with a permanently-on switch. Accordingly, the impedance range of the digital potentiometer of the third embodiment is divided into three ranges: (1) a first impedance range implemented by the two bulk impedance devices, which are bypassed or not bypassed in a complementary fashion; (2) a second impedance range implemented by the two strings of shunted intermediate-size impedance devices and the associated dummy structures, wherein the intermediate impedance devices of the two strings are bypassed or not bypassed so as to maintain a constant subset of the intermediate impedance devices with the other impedance devices between the first and second reference terminals; and (3) a third impedance range implemented by the string of elemental impedance devices, which is tapped via a single-turned-on one of the wiper switches. The two dummy structures help to improve linearity when switching the wiper between adjacent ranges. The third embodiment results in a significant savings in the number of components required to implement the same wiper address range as the conventional digital potentiometer 100 of FIG. 1 (e.g., approximately 80% for an 8-bit digital potentiometer). Rather than requiring $2^n-1$ elemental impedance devices and $2^n$ wiper switches, the digital potentiometer of the third embodiment requires only $2^{[n/2]}-1$ elemental impedance devices, $2^{[n/2]}$ wiper switches, two strings each including $2^{[(n-1)/2]}-1$ intermediate-size impedance devices and one dummy structure, two sets of $2^{[(n-1)/2]}-1$ shunt switches, with each set being associated with a respective one of the two strings of intermediate-size impedance devices, two bulk impedance devices, and two shunt switches each associated with a respective one of the two bulk impedance devices.

A fourth exemplary embodiment of the present invention includes an n-bit digital potentiometer having some features similar to the third embodiment described above, including a string of elemental impedance devices, two bulk impedance devices, and two strings of shunted intermediate impedance devices, with each string including a dummy structure, all coupled between the first and second reference terminals. In the fourth embodiment, however, the each of the bulk impedance devices is part of a bulk structure that includes the bulk impedance device itself and a dummy structure, and a shunt switch coupled so that both the bulk impedance device and the dummy structure may be bypassed. In addition, the arrangement of the impedance devices between the first and second reference terminals is changed relative to the third embodiment. In particular, each of the two bulk structures is coupled between a respective one of the ends of the elemental impedance device string and an end of a respective one of the two strings of shunted intermediate impedance devices. Meanwhile, an opposite end of each of the two strings of shunted intermediate impedance devices is coupled to one or the other of the first and second reference terminals. In other words, a respective one of the shunted intermediate impedance device strings is coupled to each of the first and second reference terminals, and a respective one of the bulk structures is disposed between each of the shunted intermediate impedance device strings and each of the two opposed ends of the elemental impedance string. This change in the arrangement of the impedance devices relative to that of the third embodiment can further improve the linearity of the digital potentiometer. The fourth embodiment likewise achieves a significant savings in the number of components to implement the same wiper address range as the conventional digital potentiometer 100 of FIG. 1, having only two dummy structures in addition to the components of the third embodiment.

These and other aspects of the present invention may be further understood by reference to the following detailed description, and the accompanying drawings, of the exemplary embodiments.

BRIEF DESCRIPTION OF THE DRAWINGS

Common reference numerals are used throughout the drawings and detailed description to indicate like elements. Redundant discussion of features having the same reference numbers typically is omitted.

DETAILED DESCRIPTION

Practitioners will appreciate that a digital potentiometer, including those described in detail below, may be implemented with resistors, capacitors, or inductors, or combination of resistors, capacitors, and/or inductors. "Impedance" is a term that encompasses both the resistance provided by resistors, and the reactance provided by capacitors and inductors, i.e., impedance=resistance+reactance. The term "impedance device," therefore, includes devices that may be entirely resistive, entirely reactive, or a combination of resistive and reactive. However, for ease of explanation and simplicity of the figures, our exemplary digital potentiometers 200, 300, 350, and 450 are shown as only having resistors in series between end terminals 102 and 104, but practitioners should understand that the resistors of digital potentiometers 200, 300, 350, and 450 could be replaced by reactance elements, or a combination of resistors and reactance elements. Practitioners attempting to replicate our resistor embodiments using reactance elements may have to make certain readily-apparent changes due to the use of the reactive elements, such as, for instance, changing a string of resistors in series to a string of capacitors in parallel.

Figure 1:
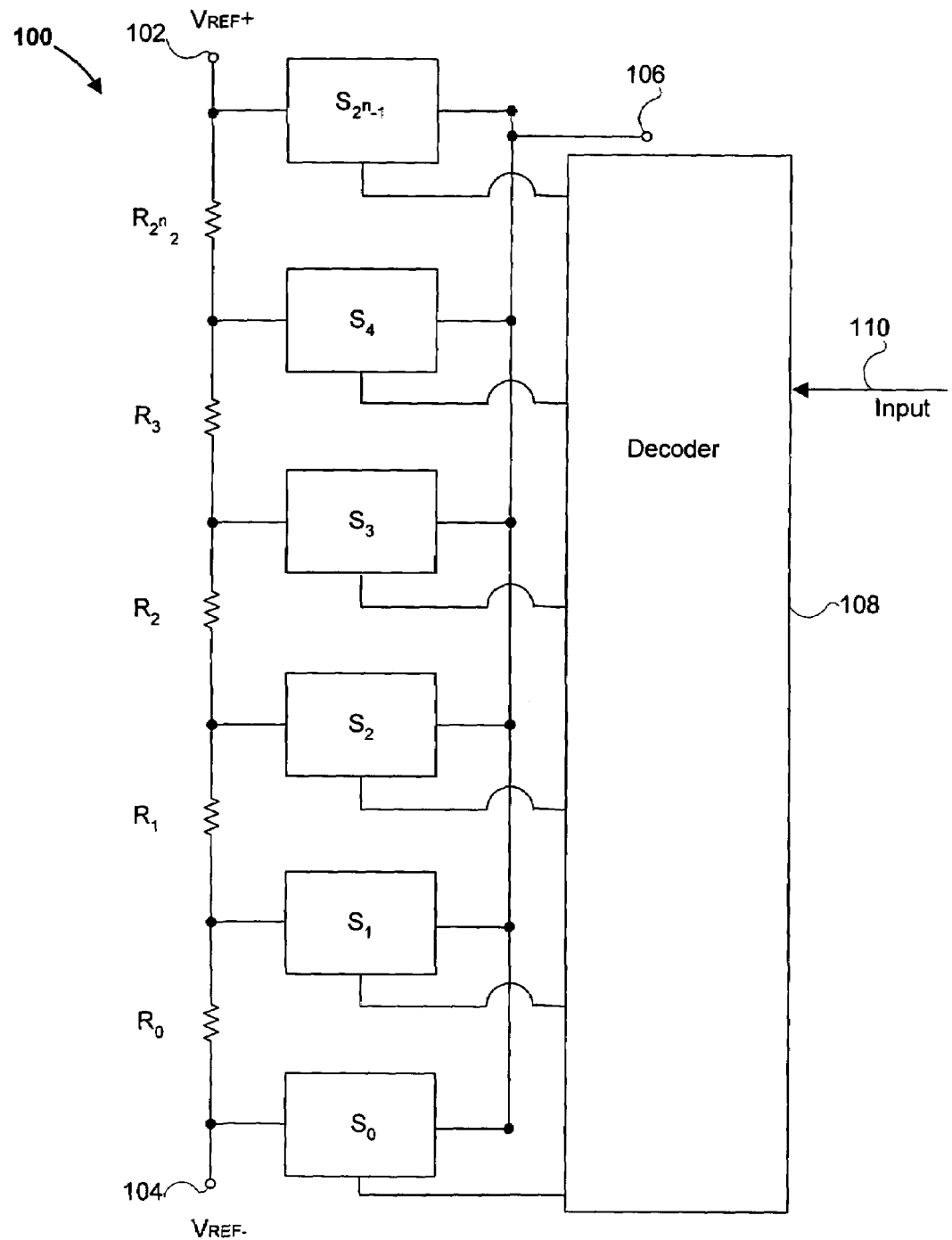
FIG. 1 is a schematic diagram of a conventional digital potentiometer.
Figure 2:
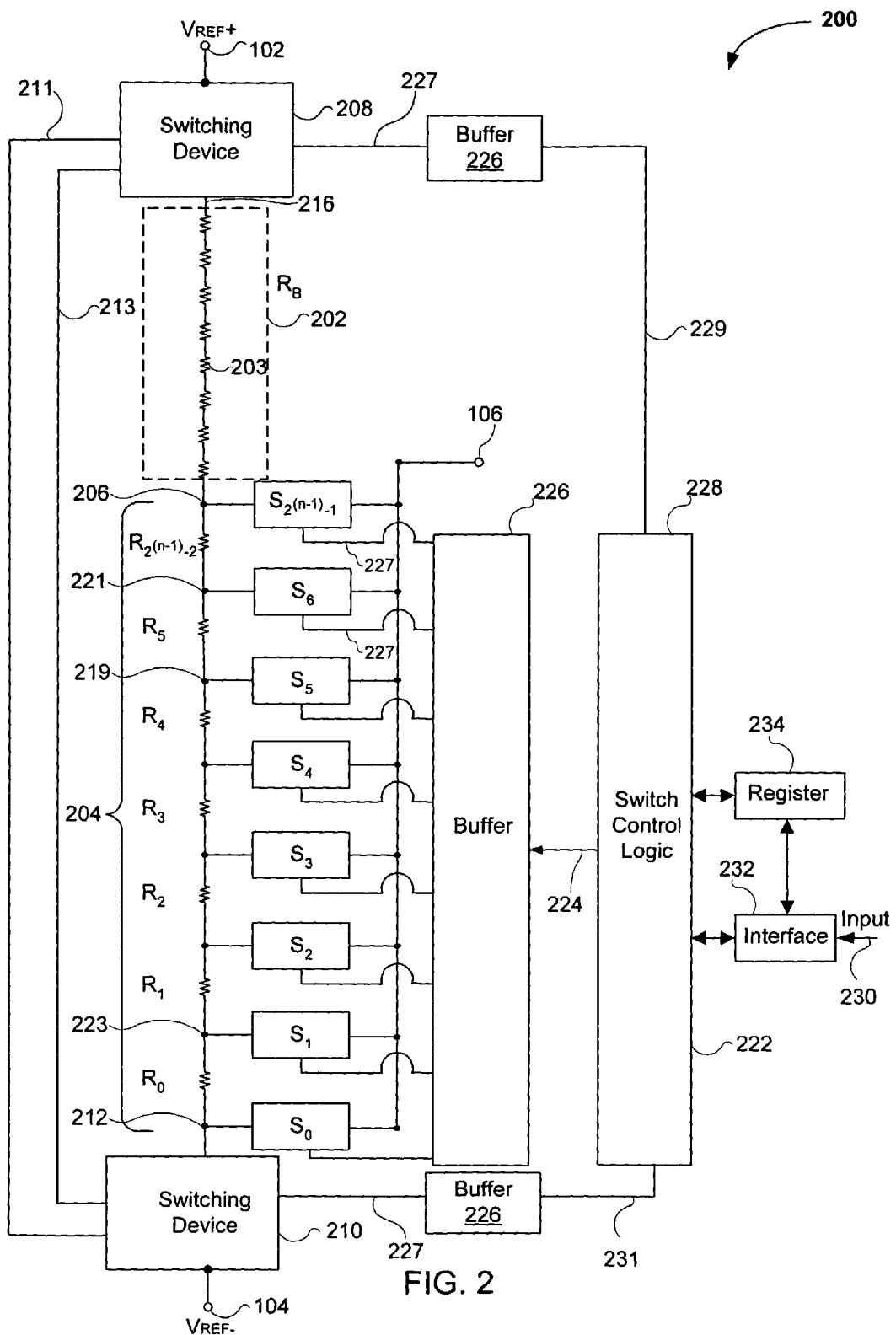
FIG. 2 is a schematic diagram of a digital potentiometer in accordance with a first exemplary embodiment of the present invention.

FIG. 2 illustrates a digital potentiometer 200, in accordance with one embodiment of the present invention. Digital potentiometer 200 has the same functionality as conventional digital potentiometer 100 of FIG. 1, but at a much reduced cost and with greater simplicity and reliability.

Digital potentiometer 200 includes a bulk resistor $R_B$ 202 and a string 204 of elemental resistors $R_0$–$R_2^{n-1}{}_{-2}$. The bulk resistor $R_B$ 202 and the string 204 are shown as being connected in series at a node 206.

Opposite the node 206, the bulk resistor $R_B$ 202 is connected to a switching device 208 at an end node 216 of the bulk resistor $R_B$ 202. The switching device 208 selectively interconnects the end node 216 of the bulk resistor $R_B$ 202 to either end terminal 102 or to end terminal 104 via line 211.

Opposite the node 206, the string 204 of elemental resistors is connected to a switching device 210 at an end node 212 of the string 204. The switching device 210 selectively interconnects the end node 212 of the string 204 to either end terminal 102 via line 213 or to end terminal 104.

End terminal 104 may be coupled to a low reference voltage $V_{REF-}$, and end terminal 102 may be coupled to a high reference voltage $V_{REF+}$. In one embodiment, reference voltage $V_{REF+}$ is about 5 volts and reference voltage $V_{REF-}$ is ground (0 volts).

The string 204 includes $2^{n-1}-1$ elemental resistors in series, including a first elemental resistor $R_0$, a last elemental resistor $R_2^{n-2}{}_{-2}$, and one or more intermediate elemental resistors $R_1$–$R_2^{n-1}{}_{-3}$. Each of the intermediate resistors $R_1$–$R_2^{n-1}{}_{-3}$ of string 204 is connected to each of the two resistors adjacent to it at a node, of which nodes 219 and 221 are typical. Each of the elemental resistors $R_0$–$R_2^{n-1}{}_{-2}$ has approximately a same resistance value.

The bulk resistor $R_B$ 202 has a resistance value of approximately $2^{n-1}$ times the resistance value of one of the elemental resistors $R_0$–$R_2^{n-1}{}_{-2}$. The bulk resistor $R_B$ 202 may comprise a single resistive element or a resistor network having multiple resistors 203 where the total combined resistance value of the resistors 203 is approximately equal to $2^{n-1}$ times the resistance value of one of the elemental resistors $R_0$–$R_2^{n-1}{}_{-2}$. In other words, the resistance of bulk resistor $R_B$ 202 is greater than the total resistance of string 204 of elemental resistors $R_0$–$R_2^{n-1}{}_{-2}$ by the resistance value of one of the elemental resistors $R_0$–$R_2^{n-1}{}_{-2}$.

A set of $2^{n-1}$ electrically controllable wiper switches $S_0$–$S_2^{n-1}{}_{-1}$ is connected to and associated with the string of resistors 204. One terminal of each of the respective wiper switches $S_0$–$S_2^{n-1}{}_{-1}$ is connected to a respective node of the string of resistors 204 and the other terminal of the wiper switch is connected to a third terminal of digital potentiometer 200, i.e., wiper terminal 106. Each of the elemental resistors $R_0$–$R_2^{n-1}{}_{-2}$ of the string of resistors 204 has one of the wiper switches $S_0$–$S_2^{n-1}{}_{-2}$ connected at each of the two ends thereof. For instance, a terminal of the switch $S_0$ is connected to an end of resistor $R_0$ at the node 212 and a terminal of the switch $S_1$ is connected to an opposite end of resistor $R_0$ at node 223. The wiper switches $S_0$–$S_2^{n-1}{}_{-1}$ may be implemented as one or more transistors.

As mentioned above, switching devices 208 and 210 control the coupling of end nodes 212 and 216 to end terminals 104 and 102. Switching device 208 operates in complementary fashion with the switching device 210, such that when the switching device 208 connects the end node 216 to end terminal 104, the switching device 210 connects the end node 212 to end terminal 102, and when the switching device 208 connects the end node 216 to end terminal 102, the switching device 210 connects the end node 212 to end terminal 104. Switching device 208 is controlled by binary input signals provided by switch control logic block 228 via a buffer 226 and lines 229 and 227, and switching device 210 is controlled by binary input signals provided by switch control logic block 228 via another buffer 226 and lines 231 and 227. The buffers 226 may be used to increase the drive power of the signals provided to switching devices 208 and 210. In addition, depending on the design of switching devices 208 and 210, the buffer 226 may also create a signal complementary to the signal received from switch control logic block 228, and may provide both the original signal and its complement to the switching devices 208 and 210, as indicated below with respect to FIGS. 2A and 2B.

Figure 2A:
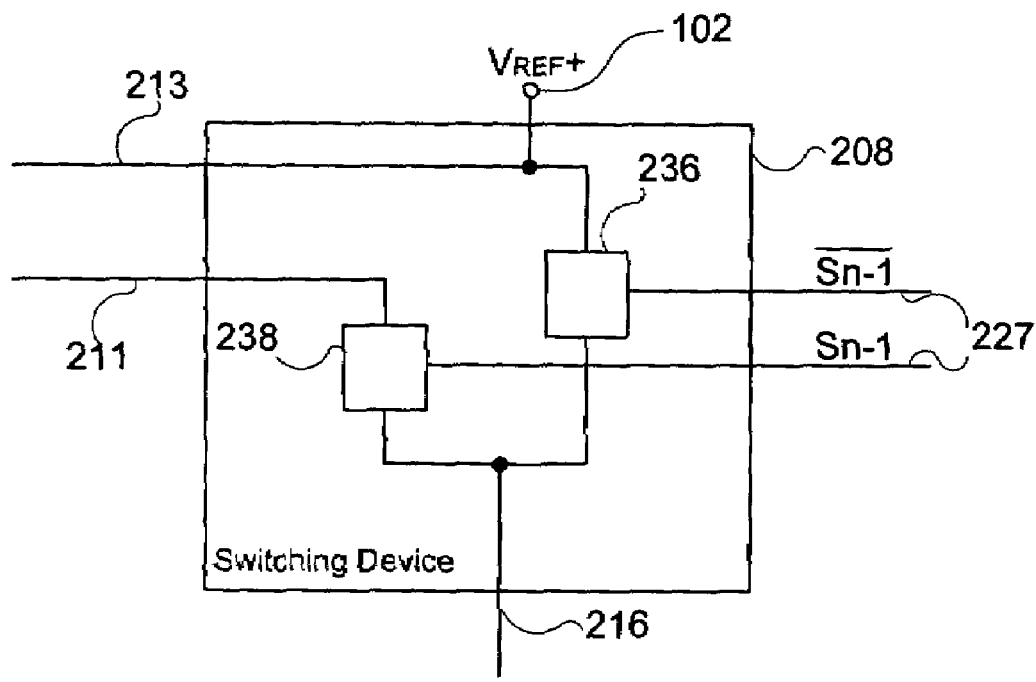
FIGS. 2A and 2B each illustrate a switching device useable in the digital potentiometer of FIG. 2.

FIG. 2A illustrates one embodiment of the switching device 208 of FIG. 2. The switching device 208 of FIG. 2A includes switches 236 and 238. One terminal of the switch 236 is connected to high reference voltage $V_{REF+}$ via end terminal 102 and the other terminal of the switch 236 is connected to the end node 216 of bulk resistor $R_B$ 202. One terminal of the switch 238 is connected to low reference voltage $V_{REF-}$ via line 211 and end terminal 104 (see, FIG. 2B) and the other terminal of the switch 238 is connected to the end node 216. The switches 236 and 238 receive complementary control signals over control line 227 from the switch control logic block 228 via the associated buffer 226 (FIG. 2). Thus, the switches 236 and 238 operate in complementary fashion, either connecting the end node 216 to end terminal 102 via the switch 236 or connecting the end node 216 to end terminal 104 via the switch 238. To ensure complementary operation, buffer 226 (FIG. 1) may provide complementary inputs $S_{n-1}$ and $\overline{S_{n-1}}$ to switches 238 and 236, respectively, via a pair of lines 227.

The switches 236 and 238 of switching device 208 may comprise N-channel or P-channel MOSFET transistors or bipolar transistors. Alternatively, the switches 236 and 238 may comprise CMOS transistors. Where the respective switches are implemented as one or more transistors, the control signals may be coupled to the gate or base of the transistor(s).

Figure 2B:
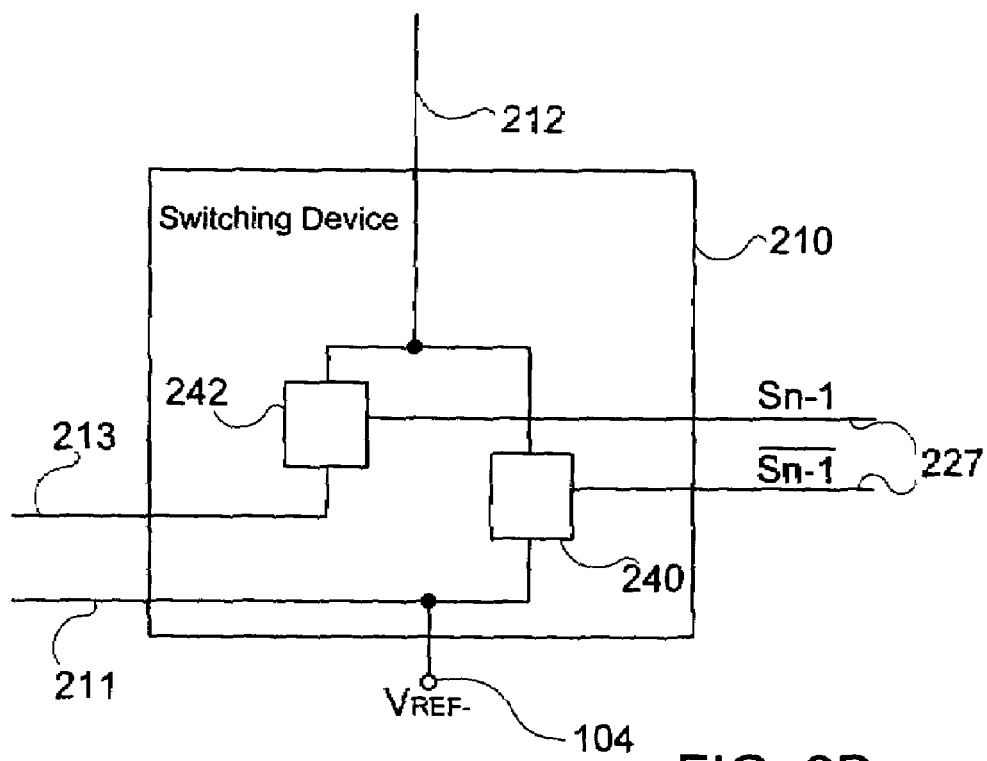

FIG. 2B illustrates one embodiment of the switching device 210 of FIG. 2. The switching device 210 of FIG. 2B includes switches 240 and 242. One terminal of the switch 240 is connected to low reference voltage $V_{REF-}$ via end terminal 104 and the other terminal of the switch 240 is connected to the end node 212 (FIG. 2). One terminal of the switch 242 is connected to high reference voltage $V_{REF+}$ via line 213 and end terminal 102 (see, FIG. 2A) and the other terminal of the switch 242 is connected to the end node 212. The switches 240 and 242 receive complementary control signals over control line 227 from the switch control logic block 228 via the associate buffer 226 (FIG. 2). Thus, the switches 240 and 242 operate in complementary fashion, either connecting the end node 212 to end terminal 102 via the switch 242 and line 213 or connecting the end node 212 to end terminal 104 via the switch 240. To ensure complementary operation, the buffer 226 (FIG. 2) may provide complementary inputs $S_{n-1}$ and $\overline{S_{n-1}}$ to switches 242 and 240, respectively, via a pair of lines 227.

The switches 240 and 242 of switching device 210 may comprise N-channel or P-channel MOSFET transistors or bipolar transistors. Alternatively, the switches 240 and 242 may comprise CMOS transistors. Where the respective switches are implemented as one or more transistors, the control signals may be coupled to the gate or base of the transistor(s).

Returning to FIG. 2, an interface 232 of digital potentiometer 200 receives an encoded, binary input signal 230 from an external source. The external source may be a device external to an integrated circuit containing digital potentiometer 200, or another circuit within the same integrated circuit as digital potentiometer 200. Input signal 230 may include an n-bit wiper address and/or other data and/or instructions for digital potentiometer 200. Various types of structures may be used to implement interface 232, such a serial interface or a parallel interface.

Register 234 is a storage device. Register 234 is coupled to receive data or command inputs from, or to provide data outputs to, interface 232 and switch control logic block 228. For instance, the interface 232 may provide the encoded binary input signal 230, or a portion of it, to register 234. Register 234 may be a non-volatile device, such as an EEPROM (electrically erasable programmable read-only memory) or other type of flash memory, or a volatile device. Register 234 may be omitted in alternative embodiments.

In one embodiment, a non-volatile register 234 stores an initial wiper position value that may be provided to switch control logic block 228 at system start up for implementation by switch control logic block 228. The initial wiper position may be a last wiper position of digital potentiometer 200 before an immediately prior turn-off of digital potentiometer 200, or may be a universal start-up value, e.g., a lowest wiper position, a highest wiper position, or a middle wiper position. Where register 234 is a volatile device, switch control logic block 228 will be programmed to implement a default wiper position (e.g., a wiper position in the middle of the wiper address range) upon power-on, and then may either increment or decrement the wiper position from the default wiper position, or may jump to a distal (i.e., non-incremental) wiper position from the default position, based on a subsequent input n-bit wiper address.

Switch control logic block 228 may perform several functions, including: (1) decoding of wiper address input signals received from an external source via interface 232 or from register 234 to determine a new wiper address; (2) control and execution of switching algorithms to implement the specified wiper address; and (3) executions of any instructions received from external control devices. Control and execution of the switching algorithm includes: (1) execution of the switching of wiper switches $S_0-S_2{}^{n-1}{}_{-1}$; (2) execution of the switching of switching devices 208 and 210; and (3) synchronization of the switching of wiper switches $S_0-S_2{}^{n-1}{}_{-1}$ and switching devices 208 and 210. In one embodiment, switch control logic block 228 uses a first portion of an input n-bit wiper address, e.g., the MSB (Most Significant Bit (bit n–1)), to control the switching devices 208 and 210, and uses the remaining, lesser bits of the n-bit wiper address excluding the MSB, e.g., bit (n–2) and lower, to control a configuration of wiper switches $S_0-S_2{}^{n-1}{}_{-1}$.

Switch control logic block 228 may have the capability of determining, during a switching sequence in which the connection of the wiper terminal 106 is changed from one internal node of digital potentiometer 200 to another, whether the wiper terminal 106 is connected to one internal node or to a plurality of internal nodes, or is not connected to any internal node (i.e., a high impedance state relative to the internal nodes).

Switch control logic block 228 may be implemented, in perhaps a most simple form, as a decoder, or a decoder and a counter. Alternatively, switch control logic block 228 may be a state machine having a multiplicity of states. Conventional logic circuitry, a programmable logic device (PLD), a read-only memory (ROM), or a processor and software, may be used to form switch control logic block 228.

Switch control logic block 228 may include a volatile wiper register to store an n-bit wiper address implemented and/or to be implemented by switch control logic block 228. The volatile register may store a wiper address or other input received from interface 232 or register 234.

Switch control logic block 228 provides binary control signals to wiper switches $S_0-S_2{}^{n-1}{}_{-1}$ via a buffer 226 and lines 224 and 227. Line 224 couples switch control logic block 228 to buffer 226, and one or more of the plurality of lines 227 couple buffer 226 to each respective wiper switch $S_0-S_2{}^{n-1}{}_{-1}$. Depending on the type of wiper switches $S_0-S_2{}^{n-1}{}_{-1}$ used, the buffer 226 may provide a pair of complementary signals over a pair of lines 227 to each wiper switch $S_0-S_2{}^{n-1}{}_{-1}$. Buffer 226 may also increase the drive power of the signals. Where the respective wiper switches $S_0-S_2{}^{n-1}{}_{-1}$ are each implemented as one or more transistors, the respective lines 227 may be coupled to the gate or base of the transistor(s).

The control signal(s) provided by switch control logic block 228 to each of the wiper switches $S_0-S_2{}^{n-1}{}_{-1}$ via buffer 226 are based on bits of the input n-bit wiper address other than the MSB, e.g., bit n–2 and lower, and specify which of wiper switches $S_0-S_2{}^{n-1}{}_{-1}$ is (or are) to be turned on, and which of wiper switches $S_0-S_2{}^{n-1}{}_{-1}$ are turned off at any given point in time. Depending on the switching sequence used, and the particular moment in time during a switching sequence, all of wiper switches $S_0-S_2{}^{n-1}{}_{-1}$ may be off, one of the wiper switches $S_0-S_2{}^{n-1}{}_{-1}$ may be on and the remainder of the wiper switches $S_0-S_2{}^{n-1}{}_{-1}$ may be off, or two or more wiper switches $S_0-S_2{}^{n-1}{}_{-1}$ may be on and the remainder of wiper switches $S_0-S_2{}^{n-1}{}_{-1}$ may be off, among other possibilities.

From the above-described structure of digital potentiometer 200, practitioners will readily perceive significant differences in comparison to the conventional structure of FIG. 1. For instance, rather than requiring $2^n-1$ elemental resistors and $2^n$ switches, as is required in the conventional digital potentiometer 100 of FIG. 1, the digital potentiometer 200 requires only $2^{n-1}-1$ elemental resistors, $2^{n-1}$ wiper switches, one bulk resistor having a resistance of $2^{n-1}$ times one of the elemental resistors, and two end-terminal switching devices. This amounts to a significant reduction, approximately 50%, in the number of resistors and switches in comparison to digital potentiometer 100. Accordingly, use of digital potentiometer 200 may be expected to yield savings in chip area and cost, and to provide improved performance and increased reliability.

As a particular example, assume that digital potentiometers 100 and 200 are eight bit digital potentiometers with 256 wiper positions. In such a case, conventional digital potentiometer 100 would have 255 elemental resistors and 256 wiper switches. By contrast, digital potentiometer 200 has only 127 elemental resistors, 128 wiper switches, one bulk resistor having a resistance of 128 times one of the elemental resistors, and two end-terminal switching devices.

At this point in our discussion, it is submitted that the reader's understanding of digital potentiometer 200 will be aided by some examples showing the operation of switch control logic block 228 in response to input signals 230 specifying wiper address changes. After the examples, a further discussion of switching methods and algorithms will be provided.

EXAMPLE 1

In this example, digital potentiometer 200 will start at a lowest output voltage position, e.g., with an output voltage $V_w$ at the wiper terminal 106 equal to reference voltage $V_{REF-}$ (e.g., ground), and will incrementally increase the output voltage $V_w$ to a highest output voltage position, e.g., with an output voltage $V_w$ at the wiper terminal 106 equal to reference voltage $V_{REF+}$ (e.g., 5 V). For ease of explanation, switch configurations are discussed in terms of their states "before" and "after" the switching operation, and not in terms of their states during the switching operation.

At the lowest output voltage position, digital potentiometer 200 has a configuration with: (1) switching device 210 connecting the end node 212 to end terminal 104, which is coupled to the low reference voltage $V_{REF-}$; (2) the switching device 208 connecting the end node 216 to end terminal 102, which is coupled to the high reference voltage $V_{REF+}$; and (3) the wiper switch $S_0$ alone turned on to tap the string of resistors 204 at the node 212. The other wiper switches, i.e., wiper switches $S_1$–$S_2^{n-1}{}_{-1}$, are off.

From this lowest output voltage position, the output voltage $V_w$ at the wiper terminal 106 may be incrementally increased by providing successive input signals 230 with sequentially incremented wiper addresses. In response, switch control logic block 228 increments the identity of the single turned-on-one of the wiper switches from switch $S_0$ to switch $S_1$, from switch $S_1$ to switch $S_2$, and so on through switch $S_2^{n-1}{}_{-1}$. For instance, when switch $S_1$ is turned on, the output voltage $V_w$ at the wiper terminal 106 is a function of the resistance of resistor $R_0$. When switch $S_2^{n-1}{}_{-1}$ is turned on, the output voltage $V_w$ at the wiper terminal 106 is a function of the resistance of resistors $R_0$–$R_2^{n-1}{}_{-2}$, i.e., all of the resistors of string 204.

To further increment the output voltage $V_w$ beyond that associated with all of the elemental resistors $R_0$–$R_2^{n-1}{}_{-2}$ of string 204, switch control logic block 228 must change the configuration of the switching devices 208 and 210 so that the switching device 208 connects the end node 216 to the end terminal 104 and the switching device 210 connects the end node 212 to the end terminal 102. Switch $S_2^{n-1}{}_{-1}$ remains the only turned-on switch of the wiper switches $S_0$–$S_2^{n-1}{}_{-1}$. Since the resistance of bulk resistor $R_B$ 202 is equal to $2^{n-1}{}_{-1}$ times the resistance value of one of the minor resistors $R_0$–$R_2^{n-1}{}_{-2}$ i.e., is greater than the combined series resistance of string 204 by the resistance value of one of the elemental resistors $R_0$–$R_2^{n-1}{}_{-2}$, the switching operation accomplishes an increment in the output voltage $V_w$ due to the one additional resistance value of bulk resistor $R_B$ 202.

To further increment the output voltage $V_w$ at wiper terminal 106, switch control logic block 228 may decrement the identity of the single turned-on-one of the wiper switches from the last wiper switch $S_2^{n-1}{}_{-1}$ through the first wiper switch $S_0$, i.e., in the embodiment of FIG. 2 from switch $S_2^{n-1}{}_{-1}$ to switch $S_6$, and then from switch $S_6$ to switch $S_5$, and so on to switch $S_0$. When switch $S_0$ is activated after the above-described switching of the end nodes 212 and 216, the output voltage $V_w$ at wiper terminal 106 is at the highest voltage position.

Thus, the digital potentiometer 200 provides a first set of output voltage $V_w$ values when the end node 216 is connected to the end terminal 102 and the end node 212 is connected to the end terminal 104. The digital potentiometer 200 provides a second set of output voltage $V_w$ values when the end node 216 is connected to the end terminal 104 and the end node 212 is connected to the end terminal 102. The sequence of the switching may vary.

EXAMPLE 2

In this example, digital potentiometer 200 will start at a particular output voltage position, and will change to other output voltage positions in a non-incremental fashion. For instance, assume an initial configuration in the lower half of the resistance range of digital potentiometer 200 where: (1) the switching device 210 is connecting the end node 212 to end terminal 104, which is coupled to the low reference voltage $V_{REF-}$ (e.g., ground); (2) the switching device 208 is connecting the end node 216 to end terminal 102, which is coupled to the high reference voltage $V_{REF+}$ (e.g., 5 V); and (3) the wiper switch $S_3$ alone is turned on to tap the string 204 of resistors. Accordingly, the output voltage $V_w$ at wiper terminal 106 would be a function of resistors $R_0$, $R_1$, and $R_2$.

If, for instance, an input signal 230 then is received by switch control logic block 228 that requires an increase in the output voltage $V_w$ to the output voltage associated with resistor $R_5$ of string 204, then switch control logic block 228 accomplishes this result by turning off switch $S_3$ and turning on switch $S_6$.

If, for instance, another n-bit input signal 230 is then received by switch control logic block 228 that requires an increase in the output voltage $V_w$ beyond that associated with the last resistor $R_2^{n-1}{}_{-2}$ of string 204 and into the upper half of the resistance range of digital potentiometer 200, then the configuration of switching devices 208 and 210 must be changed. For instance, assume that digital potentiometer 200 is a four bit digital potentiometer with 16 wiper positions, seven elemental resistors and eight wiper switches, and that an input wiper address requires that the wiper address be increased by five resistance increments beyond the resistance associated with resistor $R_5$ (see the example of the previous paragraph). Switch control logic block 228 would accomplish this result by changing the configuration digital potentiometer 200 so that: (1) the switching device 208 connects the end node 216 to the end terminal 104 and the switching device 210 connects the end node 212 to the end terminal 102; and (2) switch $S_4$ is on. Accordingly, the output voltage $V_w$ at wiper terminal 106 would be a function of bulk resistor $R_B$ 202 and resistors $R_4$, $R_5$, and $R_2{}^{n-1}{}_{-2}$ (i.e., $R_7$ where n=4) The sequence of the switching may vary.

As can be seen from the above examples, specific switching algorithms are executed by switch control logic block 228 of digital potentiometer 200 of FIG. 2 in response to an input signal requesting a change in wiper position. The address range of digital potentiometer 200 may be divided into two ranges: (1) a high address range (HAR) specified by a logical one MSB in an wiper address; and (2) a low address range (LAR) specified by a logical zero MSB in the wiper address. Accordingly, there are four significant types of wiper address change: (1) from a LAR wiper address to another LAR wiper address; (2) from a LAR wiper address to a HAR wiper address; (3) from a HAR wiper address to another HAR wiper address; and (4) from a HAR wiper address to a LAR wiper address. With respect to address change types (1) and (3) above, the identity of the single turned-on-one of the switches $S_0-S_2{}^{n-1}{}_{-1}$ changes, but the configuration of switching devices 208 and 210 (i.e., end nodes 212, 216) does not change. With respect to address change types (2) and (4) above, which involve a change from the LAR to the HAR, or vice versa, most cases involve a change in the configuration of both wiper switches $S_0-S_2{}^{n-1}{}_{-1}$ and switching devices 208 and 210. However, for a small subset of address changes of the types (2) and (4), only the positions of switching devices 208 and 210 (i.e., end nodes 212 and 216) change.

The manner in which switch control logic block 228 implements the switching associated with a wiper address change may vary. A switching sequence may be defined relative to the number of internal nodes to which, at any given moment, the wiper terminal 106 is connected, and relative to the order in which the wiper terminal 106 connects to the one or more internal nodes, during a wiper address change.

For example, switch control logic block 228 may use a make-before-break (MBB) switching sequence, or a break-before-make (BBM) switching sequence, or a combination of MBB and BBM switching sequences, depending on what switches are being turned on and off. In a MBB switching sequence, while the wiper terminal 106 is still connected to a first internal node, the wiper terminal 106 is connected to a second internal node, and then, after other events complete, the wiper terminal 106 is disconnected from the first internal node. In other words, a new connection is made before a previous connection is broken. In a BBM sequence, the wiper terminal 106 is disconnected from a first internal node, leaving it in high impedance state relative to the internal node, and then, after other events complete, the wiper terminal 106 is connected to a second internal node. In other words, a new connection is made only after a previous connection was broken. Any combination of MBB and BBM switching sequences may be implemented for the wiper switches $S_0-S_2{}^{n-1}{}_{-1}$ and switching devices 208 and 210 based on the requirements of the application supported by digital potentiometer 200. Moreover, the states of the switching sequences for wiper switches $S_0-S_2{}^{n-1}{}_{-1}$ and switching devices 208 and 210 may overlap or interlace in time. One particular switching sequence for the wiper switches $S_0-S_2{}^{n-1}{}_{-1}$ and combined with one particular switching sequence for terminal switching devices 208 and 210 define a switching algorithm.

For example, the order in which the reference terminals and wiper switches change states may be: (1) change wiper switches $S_0-S_2{}^{n-1}{}_{-1}$ and switching devices 208 and 210 simultaneously; (2) first change wiper switches $S_0-S_2{}^{n-1}{}_{-1}$, then change switching devices 208 and 210; or (3) first change switching devices 208 and 210, then change wiper switches $S_0-S_2{}^{n-1}{}_{-1}$.

In another implementation, the switching algorithm may interlace various states of the switching sequences for wiper switches $S_0-S_2{}^{n-1}{}_{-1}$ and switching devices 208 and 210. Assuming notations such as DW=disconnect wiper, RW=reconnect wiper, DT=disconnect reference terminals, RT=reconnect reference terminals, and HiZ=high impedance, the following switching algorithms may be considered: (1) DW (HiZ); DT (HiZ); RT; RW; (2) DW (HiZ); DT (HiZ); RW; RT; (3) DI (HiZ); DW (HiZ); RW; RT; and (4) DT (HiZ); DW (HiZ); RT; RW.

These changes of wiper switch state and terminal switching device state affect the electric signals through the digital potentiometer 200 and at the wiper terminal 106. Certain applications for digital potentiometer 200 require limited variations of such electric signals. These restrictions may translate, for example, in limited current flow and limited electric potential variations at the wiper terminal 106. As a result, a need for the control of the electric signal paths may arise. The switch control logic block 228 may provide a means to control the order in which the wiper switches $S_0-S_2{}^{n-1}{}_{-1}$ and terminal switching devices 208 and 210 change state, in a variety of combinations, according to the requirements of the target application for digital potentiometer 200. A control signal received at switch control logic block 228 via interface 232 or register 234 may change the switching algorithm used by switch control logic block 228.

In one implementation, the switch control logic block 228 may provide only one switching algorithm for controlling the wiper switches $S_0-S_2{}^{n-1}{}_{-1}$ and switching devices 208 and 210. In another implementation, the switch control logic block 228 may provide several or all possible switching algorithms for controlling the wiper switches $S_0-S_2{}^{n-1}{}_{-1}$ and switching devices 208 and 210. In other implementation, the desired algorithm for switching from one wiper address to another may be chosen from several implemented switching algorithms by an input signal 230 received by switch control logic block 228 via interface 232. In another implementation, the desired algorithm for switching from one wiper address to another may be chosen from several implemented switching algorithms by an instruction received by the switch control logic block 228 through the interface 232 and stored into register 234, configuring the function of the switch control logic block 228 as long as the instruction is resident in register 234. Again, the requirements of the application and the electrical characteristics of the digital potentiometer will inform the practitioner concerning the switching methodology.

Figure 3:
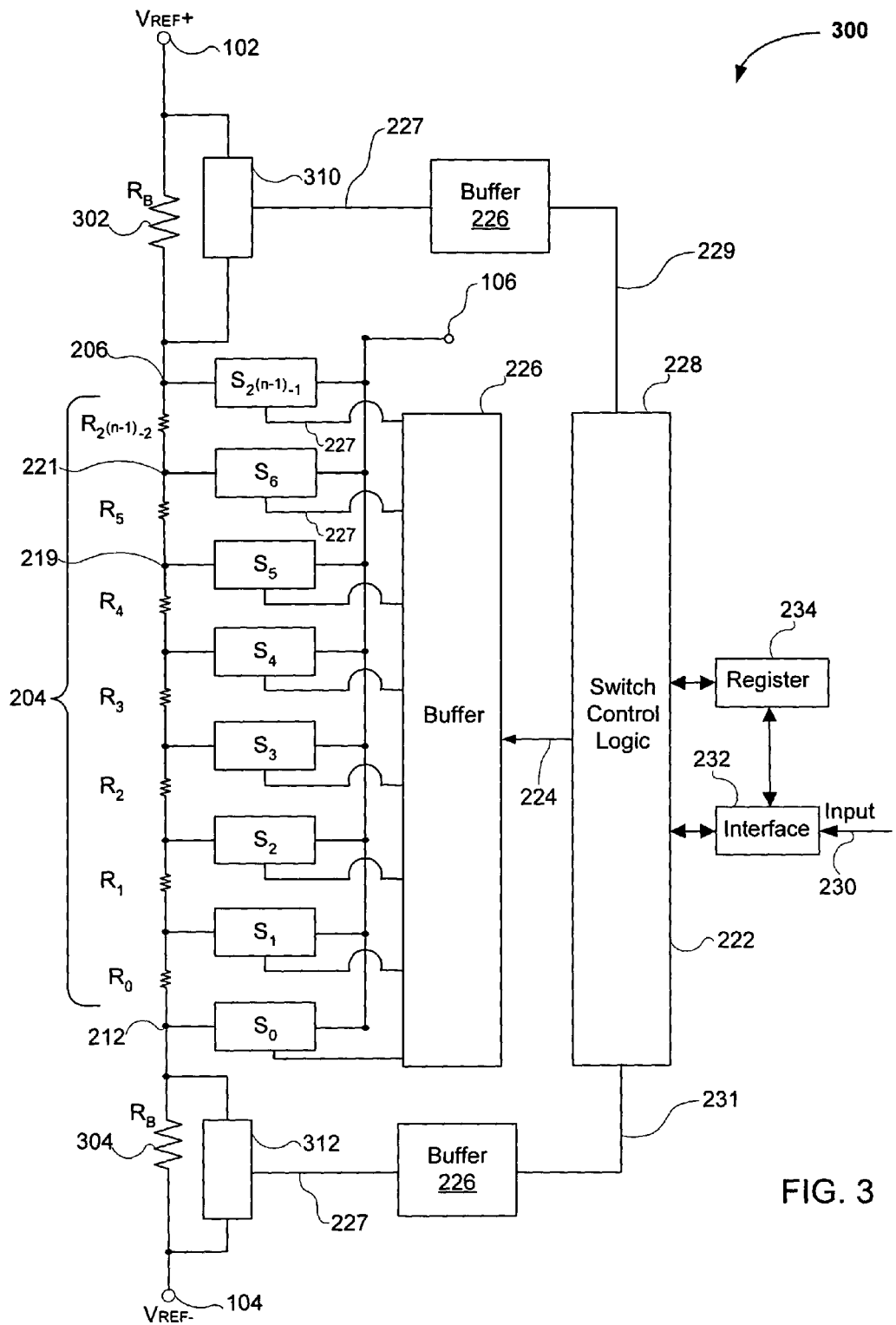
FIG. 3 is a schematic diagram of a digital potentiometer in accordance with a second exemplary embodiment of the present invention.

FIG. 3 illustrates a digital potentiometer 300 in accordance with another embodiment of the present invention. The digital potentiometer 300 is similar to the digital potentiometer 200 of FIG. 2, as described above, and includes many of the same reference numbers and features.

The digital potentiometer 300 includes a string 204 of $2^{n-1}-1$ elemental resistors, and two bulk resistor $R_B$ 302 and $R_B$ 304. One end of the bulk resistor $R_B$ 302 is connected to the end terminal 102, which is coupled to reference voltage $V_{REF+}$, and the opposite end of the bulk resistor $R_B$ 302 is connected to the string 204 at the end node 206. One end of the bulk resistor $R_B$ 304 is connected to the terminal 104, which is coupled to reference voltage $V_{REF-}$, and the opposite end of the bulk resistor $R_B$ 304 is connected to the string 204 at the node 212. In this implementation, the bulk resistor $R_B$ 302, the string of resistors 204, and the bulk resistor $R_B$ 304 are configured in series with each other.

The bulk resistors $R_B$ 302 and $R_B$ 304 may be formed in the same manner as bulk resistor $R_B$ 202 of FIG. 2. The bulk resistors $R_B$ 302 and $R_B$ 304 may have a resistance value of approximately $2^{n-1}$ times the resistance value of one of the elemental resistors of string 204.

A switching device 310 is connected between the terminal 102 and the node 206 in parallel with the bulk resistor $R_B$ 302 and serves as a shunt switch to selectively bypass the bulk resistor 302. Similarly, a switching device 312 is connected between the terminal 104 and the node 212 in parallel with the bulk resistor $R_B$ 304 and serves as a shunt switch to selectively bypass the bulk resistor $R_B$ 304.

The switching devices 310 and 312 are operated in complementary fashion by switch control logic block 228 respective buffers 226 and lines 229 and 231, respectively. In particular, when the switching device 310 is turned on, the switching device 312 is turned off, and vice versa. Accordingly, at the completion of a switching sequence, only one of bulk resistors $R_B$ 302 and $R_B$ 304 remains in series with string 204 between end terminals 104 and 102. The other of the bulk resistors $R_B$ 302 and $R_B$ 304 is bypassed by its associated switching device 310 or 312, respectively. To ensure complementary operation of switching devices 310 and 312, the switch control logic block 228 may provide switching device 312 with a control signal complimentary to that provided to switching device 310. Alternatively, switching devices 310 and 312 may be of opposite types, so that a same control signal provided to switching devices 310 and 312 will provide the complimentary configurations.

Switching devices 310 and 312 may each comprise any suitable switching device, such as N-channel or P-channel MOSFET transistors or bipolar transistors. Alternatively, the switching devices 310 and 312 may comprise CMOS transistors operated by a pair of complementary signals generated by the buffer 226 based on a signal received from switch control logic block 228. Where switching devices 310 and 312 are implemented as one or more transistors, control signals from switch control logic device 228 may be coupled to the gate or base of the transistor(s).

By comparison to conventional digital potentiometer 100 of FIG. 1, digital potentiometer 300 requires only: (1) $2^{n-1}-1$ elemental resistors $R_0-R_2{}^{n-1}{}_{-2}$; (2) $2^{n-1}$ wiper switches $S_0-S_2{}^{n-1}{}_{-1}$; (3) two bulk resistors $R_B$ 302 and $R_B$ 304 each having a resistance of $2^{n-1}$ times one of the elemental resistors; and (4) two switching devices 310 and 312. This represents a significant reduction in the number of components to implement the same wiper address range as the conventional digital potentiometer 100.

A basic structural difference between digital potentiometer 200 of FIG. 2 and digital potentiometer 300 of FIG. 3 is that, in the former, there is only one bulk resistor $R_B$ 202, and in the latter, there are two bulk resistors $R_B$ 302 and $R_B$ 304. Bulk resistor $R_B$ 202 of digital potentiometer 200 is switchable between terminals 104 and 102, but is always in series with resistor string 204 (except, depending on the switching algorithm, during wiper switching). By contrast, in digital potentiometer 300, there are bulk resistors $R_B$ 302 and $R_B$ 304, one or the other of which is bypassed, so that only one of bulk resistors $R_B$ 302 and $R_B$ 304 remains in series with sting 204 at the completion of a switching sequence. While digital potentiometer 300 therefore may occupy more chip area that digital potentiometer 200, digital potentiometer 300 may be a better choice for a particular application. For instance, digital potentiometer 300 may allow a simpler and smaller design for switch control logic block 228, and may provide better electrical performance in terms of lower switching noise. Accordingly, whether to use digital potentiometer 200 or 300 depends on the application for the digital potentiometer.

The methods of operation of digital potentiometers 200 and 300 include certain similarities. As mentioned, both embodiments include a string of elemental resistors in series with at least one bulk resistor between first and second end terminals. At a high level of abstraction, both of digital potentiometers 200 and 300 implement a method that includes determining, based on a subportion of an input n-bit wiper address (e.g., the MSB), whether to use the string of elemental resistors (or the at least one bulk resistor) in a lower half portion or an upper half portion of the resistance range of the digital potentiometer, and then tapping the string of elemental resistors based on another subportion of the input n-bit wiper address. At a lower level of abstraction, the method of digital potentiometer 200 differs from the method of digital potentiometer 300 in that digital potentiometer 200 conceptually flips the orientation of the resistor (i.e., the series combination of string 204 and bulk resistor RB 202) between terminals 104 and 102 in going from the lower half of the resistance range to the upper half of the resistance range of digital potentiometer 200, while in digital potentiometer 300, one or the other of end terminals 102 and 104 conceptually moves, depending on which one of bulk resistors RB 302 and RB 304, respectively, is bypassed, so that the elemental resistor string 204 will be in the lower half portion or the upper half portion, respectively, of the resistance range of the digital potentiometer 300.

Readers will appreciate that the switching sequences and algorithms employed in digital potentiometer 300, such as whether MBB, BBM, or combinations of MBB and BBM sequences are used, can vary, depending on the application, as discussed above with respect to digital potentiometer 200.

The following examples are provided to illustrate the operation of digital potentiometer 300 of FIG. 3.

EXAMPLE 3

In this example, digital potentiometer 300 will start at a lowest output voltage position, e.g., with an output voltage $V_w$ at the wiper terminal 106 equal to reference voltage $V_{REF-}$ (e.g., ground), and will incrementally increase the output voltage $V_w$ to a highest output voltage position, e.g., with an output voltage $V_w$ at the wiper terminal 106 equal to reference voltage $V_{REF+}$ (e.g., 5 V). For ease of explanation, switch configurations are discussed in terms of their states "before" and "after" the switching operation, and not in terms of their states during the switching operation.

At the lowest output voltage position, digital potentiometer 300 has a configuration with: (1) switching device 312 on so as to bypass bulk resistor $R_B$ 304 and connect the end node 212 to terminal 104, which is coupled to the low reference voltage $V_{REF-}$; (2) the switching device 310 off so that bulk resistor $R_B$ 302 is coupled in series with string 204 between end node 206 and terminal 102, which is coupled to the high reference voltage $V_{REF+}$; and (3) the switch $S_0$ alone is turned on to tap the string of resistors 204 at the end node 212, with the remaining wiper switches $S_1-S_2{}^{n-1}{}_{-1}$ being off.

From this lowest output voltage position, the output voltage $V_w$ at wiper terminal 106 may be incrementally increased by providing successive input signals 230 with sequentially incremented wiper addresses. In response, switch control logic block 228 increments the identity of the single turned-on-one of the wiper switches from switch $S_0$ to switch $S_1$, from switch $S_1$ to switch $S_2$, and so on through last switch $S_2{}^{n-1}{}_{-1}$, while leaving switching device 310 off and switching device 312 on. For instance, when switch $S_1$ is turned on, the output voltage $V_w$ at the wiper terminal 106 is a function of the resistance of resistor $R_0$. When last switch $S_2{}^{n-1}{}_{-1}$ alone is turned on, the output voltage $V_w$ at the wiper terminal 106 is a function of the resistance of all of the elemental resistors $R_0$–$R_2{}^{n-1}{}_{-2}$ of string 204.

To further increment the output voltage $V_w$ beyond that associated with string 204, i.e., the sum of the resistances of all of resistors $R_0$–$R_2{}^{n-1}{}_{-2}$ of string 204, the configuration of the switching devices 310 and 312 is reversed by switch control logic block 228. In particular, the configuration of digital potentiometer 300 is changed so that: (1) switching device 310 is on so that bulk resistor $R_B$ 302 is bypassed and end node 206 of string 204 is coupled to terminal 102; (2) switching device 312 is off so that bulk resistor $R_B$ 304 is coupled between end node 212 and terminal 104; and (3) wiper switch $S_0$ alone is turned on. Accordingly, the output voltage $V_w$ is a function of bulk resistor $R_B$ 304 alone of the resistors. As noted, a resistance of bulk resistor $R_B$ 304 is $2^{n-1}$ times one of the elemental resistors $R_0$–$R_2{}^{n-1}{}_{-2}$, or the resistance of one elemental resistor greater than the resistance of string 204.

From this mid-range output voltage position, the output voltage $V_w$ at wiper terminal 106 may be incrementally increased by providing successive input signals 230 with incremented wiper addresses. In response, switch control logic block 228 increments the identity of the single turned-on-one of the wiper switches from switch $S_0$ to switch $S_1$, from switch $S_1$ to switch $S_2$, and so on through last switch $S_2{}^{n-1}{}_{-1}$, while leaving switching device 310 on and switching device 312 off. For instance, when switch $S_1$ is turned on, the output voltage $V_w$ at the wiper terminal 106 is a function of the resistance of bulk resistor $R_B$ 304 and resistor $R_0$. When last wiper switch $S_2{}^{n-1}{}_{-1}$ is turned on, the output voltage $V_w$ at the wiper terminal 106 is at a maximum value that is a function of the resistance of bulk resistor $R_B$ 304 and all of the resistors $R_0$–$R_2{}^{n-1}{}_{-2}$ of string 204.

Thus, the digital potentiometer 300 provides a first set of output voltage $V_w$ values when the switching devices 312 shunts, or bypasses, the bulk resistor $R_B$ 304 and a second set of output voltage $V_w$ values when the switching device 310 shunts, or bypasses, the bulk resistor $R_B$ 302. The second set of voltage values may be higher than the first set of voltage values. A substantially constant resistance is maintained between the terminals 102 and 104 at the completion of a switching sequence. The sequence of the switching may vary.

EXAMPLE 4

In this example, digital potentiometer 300 will start at a particular output voltage position, and will change to other output voltage positions in a non-incremental fashion. For instance, assume an initial configuration in the lower half of the resistance range of digital potentiometer 300 where: (1) the switching device 310 is off, so that end node 206 of string 204 is coupled to terminal 102 and high reference voltage $V_{REF+}$ through bulk resistor $R_B$ 302; (2) switching device 312 is on, so that bulk resistor $R_B$ 302 is bypassed and end node 212 is coupled to terminal 104, which is coupled to the low reference voltage $V_{REF-}$ (e.g., ground); and (3) the wiper switch $S_2$ alone among the wiper switches $S_0$–$S_2{}^{n-1}{}_{-1}$ is turned on to tap the string 204 of resistors. Accordingly, the output voltage $V_w$ at wiper terminal 106 would be a function of resistors $R_0$ and $R_1$ of string 204. If an input signal 230 is then received by switch control logic block 228 that requires an increase in the output voltage $V_w$ beyond that associated with the last resistor of string 204 and into the upper half of the resistance range of digital potentiometer 300, then the configuration of switching devices 310 and 312 must be changed. For instance, assume that digital potentiometer 300 is a four-bit (n=4) digital potentiometer with 16 wiper positions, seven elemental resistors and eight wiper switches, and that an input wiper address requires that the wiper address be increased by ten resistance increments beyond the resistance associated with resistor $R_0$ and $R_1$. Switch control logic block 228 accomplishes this result by changing the configuration of digital potentiometer 300 so that: (1) switching device 310 is on, thereby bypassing bulk resistor $R_B$ 302 and coupling end nod 206 to terminal 102; (2) switching device 312 is off, thereby coupling end node 212 to terminal 104 through bulk resistor $R_B$ 304; and (3) wiper switch $S_4$ alone among the wiper switches $S_0$–$S_2{}^{n-1}{}_{-1}$ is turned on to tap the string 204 of elemental resistors. Accordingly, the output voltage $V_w$ at wiper terminal 106 would be a function of bulk resistor $R_B$ 304 and elemental resistors $R_0$, $R_1$, $R_2$, and $R_3$. The sequence of the switching may vary.

Figure 4:
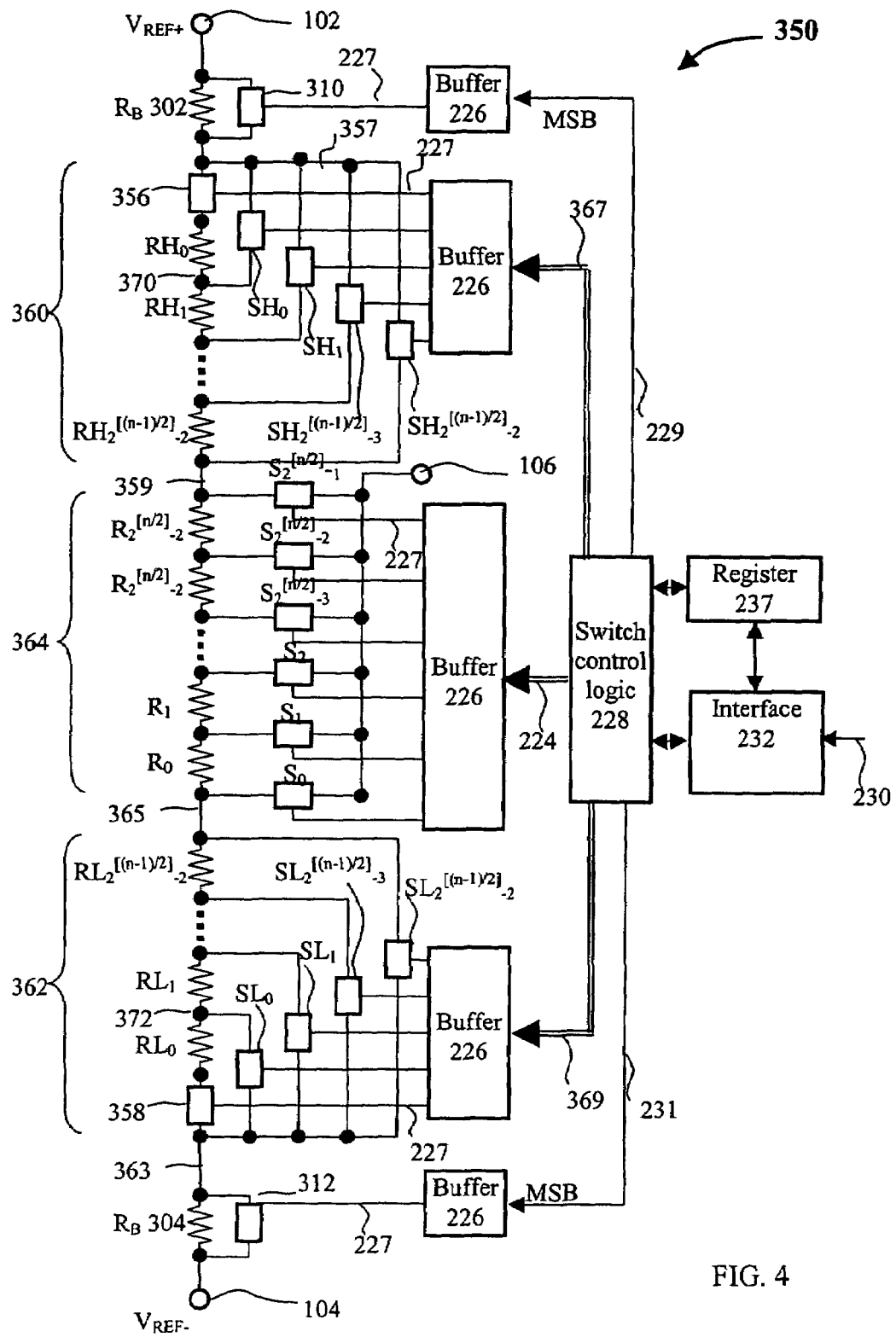
FIG. 4 is a schematic diagram of a digital potentiometer in accordance with a third exemplary embodiment of the present invention.

FIG. 4 illustrates a digital potentiometer 350 in accordance with a third embodiment of the present invention. The digital potentiometer 350 is similar in certain respects with digital potentiometer 300 described above, and includes many of the same reference numbers and features.

Like digital potentiometer 300, digital potentiometer 350 includes a string of elemental resistors in series that are tapped by wiper switches, with the string being disposed between and in series with a pair of bypassable bulk resistors $R_B$ 302 and $R_B$ 304. As in digital potentiometer 300, the bulk resistors $R_B$ 302 and $R_B$ 304 are coupled to end terminals 102 and 104, respectively, of digital potentiometer 350. Switching devices 310 and 312 allow for the bypassing of bulk resistors $R_B$ 302 and $R_B$ 304 in a complementary fashion based on control signals from switch control logic block 228, so that only one of bulk resistors $R_B$ 302 and $R_B$ 304 is in series with the other resistors between terminals 102 and 104 at the completion of any given switching sequence, thereby helping to maintain a constant series resistance between terminals 102 and 104.

A difference between digital potentiometers 300 and 350 is that, while digital potentiometer 300 has a two-stage design, in that the range of resistances is divided into two parts (i.e., a first range provided by string 204, and a second range provided by bulk resistors $R_B$ 302 and $R_B$ 304), digital potentiometer 350 has a three-stage design that divides the range of resistances into three parts.

In particular, digital potentiometer 350 includes three strings of resistors 360, 362, and 364, two identical dummy structures 356 and 358, and two bulk resistors $R_B$ 302 and $R_B$ 304, all in series between terminals 102 and 104. The resistances of digital potentiometer 350 are symmetrical around central resistor string 364. That is, the resistance of string 360 is approximately the same as the resistance of string 362, the resistance of dummy structure 356 is approximately the same as the resistance of dummy structure 358, and the resistance of bulk resistor $R_B$ 302 is approximately the same as the resistance of bulk resistor $R_B$ 304. Bulk resistors $R_B$ 302 and $R_B$ 304 are mirror images, and strings 360 and 362 are mirror images. Accordingly, the resistance range of digital potentiometer 350 is divided into three ranges: (1) a first range implemented by bulk resistors $R_B$ 302 and 304; (2) a second range implemented by resistor strings 360 and 362; and (3) a third range implemented by elemental resistor string 364.

Resistor string 364 includes $2^{[n/2]}-1$ identical elemental resistors $R_0-R_2^{[n/2]}{}_{-2}$ in series. Note that our use of square brackets [ ] around the term n/2, where n is the number of bits in a wiper address, indicates that the exponential term is the integer part of the function n÷2. This has no practical implication where n is an even number, since even numbers divide evenly by two, but does have implication where n is an odd number. That is, where n is an even number, e.g., n=8, the exponential term is 8÷2=4, which is an integer. When n is an odd number, however, e.g., n=9, the square brackets indicate that the exponential value is the integer part of 9÷2, i.e., the integer part of 4.5, which is 4. As further examples, [5.5] is 5, and [3.5] is 3.

Returning to FIG. 4, a set of electrically controllable wiper switches $S_0-S_2^{[n/2]}{}_{-1}$ is connected to and associated with the string of resistors 364. One terminal of each of the respective wiper switches $S_0-S_2^{[n/2]}$ is connected to a respective node of the string 364 and the other terminal of the wiper switch is connected to the wiper terminal 106. Each of the elemental resistors $R_0-R_2^{[n/2]}{}_{-2}$ of the string of resistors 364 has one of the switches $S_0-S_2^{[n/2]}{}_{-1}$ connected at each of the two ends of the resistor.

Each wiper switch $S_0-S_2^{[n/2]}{}_{-1}$ may be implemented by one or more transistors, and may be operated by control signals provided from switch control logic block 228 via buffer 226 and one of the lines 227, similar to the embodiments described above.

String 360 is coupled between the last elemental resistor $R_2^{[n/2]}{}_{-1}$ of string 364 and bulk resistor $R_B$ 302, i.e., between nodes 359 and 357 of digital potentiometer 350. String 360 includes $2^{[(n-1)/2]}-1$ resistors $RH_0-RH_2^{[(n-1)/2]}{}_{-2}$ and one dummy structure 356, all of which are in series. Resistors $RH_0-RH_2^{[(n-1)/2]}{}_{-2}$ each have a same resistance value of approximately $2^{[n/2]}$ times the resistance of one of the elemental resistors $R_0-R_2^{[n/2]}{}_{-2}$ (i.e., $R_0*2^{[n/2]}$). The resistance of each resistor $RH_0-RH_2^{[(n-1)/2]}{}_{-2}$ is one elemental resistor value greater than a resistance of the entire string 364 of elemental resistors $R_0-R_2^{[n/2]}{}_{-2}$.

Resistor $RH_2^{[(n-1)/2]}{}_{-2}$ is at the lower end of string 360 coupled to the output end of last resistor $R_2^{[n/2]}{}_{-2}$ of elemental resistor string 364 and the last wiper switch $S_2^{[n/2]}{}_{-1}$ at node 359, and resistor $RH_0$ is toward the opposite upper end of string 360 coupled to one terminal of dummy structure 356. An opposite terminal of dummy structure 356 is coupled to bulk resistor $R_B$ 302 and switching device 310 at node 357. The structure of dummy structure 356 is discussed below.

A first set of $2^{[(n-1)/2]}-1$ electrically controllable shunt switches $SH_0-SH_2^{[(n-1)/2]}{}_{-2}$ is connected to and associated with the string 360. One terminal of each of the respective shunt switches $SH_0-SH_2^{[(n-1)/2]}{}_{-2}$ is connected to node 357 between dummy structure 356 and bulk resistor $R_B$ 302, and the other terminal of the respective shunt switch is coupled to a respective one of plural nodes of string 360. The respective nodes of string 360 to which a respective one of the shunt switches $SH_0-SH_2^{[(n-1)/2]}{}_{-2}$ is connected include the node between each pair of adjacent, coupled resistors of string 360 and the node 359 at the end of the final resistor $RH_2^{[(n-1)/2]}{}_{-2}$ of string 360. For instance, the first shunt switch $SH_0$ is coupled between node 357 and a node of string 360 between first resistor $RH_0$ and second $RH_1$. The last shunt switch $SH_2^{[(n-1)/2]}{}_{-2}$ is coupled between node 357 and node 359, which is a point of connection of the last resistor $RH_2^{[(n-1)/2]}{}_{-2}$ of string 360 to resistor string 364. Thus, each of shunt switches $SH_0-SH_2^{[(n-1)/2]}{}_{-2}$ is coupled in parallel with a portion of string 360.

Shunt switches $SH_0-SH_2^{[(n-1)/2]}{}_{-2}$ are each coupled so that an associated portion of string 360 may be bypassed, i.e., removed from the series resistance between terminals 102 and 104. In particular, dummy structure 356 and any resistors between the node on string 360 to which the respective shunt switch $SH_0-SH_2^{[(n-1)/2]}{}_{-1}$ is connected and node 357 are bypassed when the shunt switch is on. For instance, shunt switch $SH_0$ is coupled between nodes 357 and 370 and operates so that resistor $RH_0$ and dummy structure 356 are bypassed if switch $SH_0$ is on, but are in series with the other resistors between terminals 102 and 104 if switch $SH_0$ is off. Likewise, shunt switch $SH_1$ is coupled so that resistor $RH_0$, dummy structure 356, and resistor $RH_1$ are bypassed if switch $SH_1$ is on, but are in series with the other resistors between terminals 102 and 104 if switch $SH_1$ is off. As a final example, the final shunt switch $SH_2^{[(n-1)/2]}{}_{-2}$ is coupled between nodes 357 and 359, and operates so that all of the resistors $RH_0-RH_2^{[(n-1)/2]}{}_{-2}$ and the dummy structure 356 of string 360 are bypassed if shunt switch $SH_2^{[(n-1)/2]}{}_{-2}$ is on, but are in series with the other resistors between terminals 102 and 104 if shunt switch $SH_2^{[(n-1)/2]}{}_{-2}$ is off.]

During operation of digital potentiometer 350, all of shunt switches $SH_0-SH_2^{[(n-1/2]-1}{}_{-2}$ may be on, all may be off, or some may be on and some may be off. Each of shunt switches $SH_0-SH_2^{[(n-1)/2]}{}_{-2}$ may be implemented as one or more transistors, and may be operated by control signals provided by switch control logic block 228 via an associated buffer 226 and lines 367 and 227.

String 362 is coupled between a first end of the first elemental resistor $R_0$ of string 364 and bulk resistor $R_B$ 304. String 362 is a mirror image of string 360, structurally and resistively identical. In particular, string 362 includes $2^{[(n-1)/2]}-1$ identical resistors $RL_0-RL_2^{[(n-1)/2]}{}_{-2}$ and one dummy structure 358, all in series. Resistor $RH_0$ is coupled to a first end of dummy structure 358. An opposite end of dummy structure 358 is coupled to bulk resistor $R_B$ 304 and switching device 312 at node 363. A final resistor $RL_2^{[(n-1)/2]}{}_{-2}$ at the upper end of string 362 is coupled to a first end of first resistor $R_0$ of elemental resistor string 364 and wiper switch $S_0$ at node 365.

A second set of $2^{[(n-1)/2]}-1$ electrically controllable shunt switches $SL_0-SL_2^{[(n-1)/2]}{}_{-2}$ is connected to and associated with the string 362. One terminal of each of the respective shunt switches $SL_0-SL_2^{[(n-1)/2]}{}_{-2}$ is connected to a node 363 between dummy structure 358 and bulk resistor $R_B$ 304, and the other terminal of the respective shunt switch $SL_0-SL_2^{[(n-1)/2]}{}_{-2}$ is coupled to a respective one of plural nodes of string 362. The respective nodes of string 362 to which a respective one of the shunt switches $SL_0-SL_2^{[(n-1)/2]}{}_{-2}$ is connected include the node between each pair of coupled resistors of string 362 and the node 365 at the end of the final resistor $RL_2^{[(n-1)/2]}{}_{-2}$ of string 362. For instance, the first shunt switch $SL_0$ is coupled between node 363 and a node 372 of string 362 between first resistor $RL_0$ and second resistor $RL_1$. The last shunt switch $SL_2^{[(n-1)/2]}{}_{-2}$ is coupled between node 363 and node 365, which is a point of connection of the last resistor $RL_2^{[(n-1)/2]}{}_{-2}$ to a second end of first resistor $R_0$ of elemental resistor string 364. Thus, each of shunt switches $SL_0-SL_2^{[(n-1)/2]]}{}_{-2}$ is coupled in parallel with a portion of string 362.

Shunt switches $SL_0-SL_2^{[(n-1)/2]}{}_{-2}$ are each coupled so that an associated portion of string 362 may be bypassed, i.e., removed from the series resistance between terminals 102 and 104. In particular, dummy structure 358 and any resistors between the respective node on string 362 to which the respective shunt switch $SL_0$–$SL_2^{[(n-1)/2]}{}_{-2}$ is connected and node 363 are bypassed when the shunt switch is on. For instance, shunt switch $SL_0$ is coupled so that resistor $RL_0$ and dummy structure 358 are bypassed if switch $SL_0$ is on, but are in series with the other resistors between terminals 102 and 104 if shunt switch $SL_0$ is off. Likewise, shunt switch $SL_1$ is coupled so that resistor $RL_0$, dummy structure 358, and resistor $RL_1$ are bypassed if switch $SL_1$ is on, but are in series with the other resistors between terminals 102 and 104 if switch $SL_1$ is off. As a final example, the last shunt switch $SL_2^{[(n-1)/2]}{}_{-2}$ is coupled so that all of the resistors $RL_0$–$RL_2^{[(n-1)/2]}{}_{-2}$ and dummy structure 358 of string 362 are bypassed if the shunt switch $SL_2^{[(n-1)/2]}{}_{-2}$ is on, but are in series with the other resistors between terminals 102 and 104 if the shunt switch $SL_2^{[(n-1)/2]}{}_{-2}$ is off.

During the operation of digital potentiometer 350, all of shunt switches $SL_0$–$SL_2^{[(n-1)/2]}{}_{-2}$ may be on, all may be off, or some may be on and some may be off. Each of shunt switches $SL_0$–$SL_2^{[(n-1)/2]}$ may be implemented as one or more transistors, and operated by control signals provided by switch control logic block 228 via an associated buffer 226 and lines 369 and 227.

As mentioned, string 362 is a mirror image, identical in resistance and components, as string 360. Likewise, the second set of shunt switches $SL_0$–$SL_2^{[(n-1)/2]}{}_{-2}$ associated with string 362 is a mirror image of the first set of shunt switches $SH_0$–$SH_2^{[(n-1)/2]}{}_{-2}$ associated with string 360.

During operation of digital potentiometer 350, shunt switches $SL_0$–$SL_2^{[(n-1)/2]}{}_{-2}$ and $SH_0$–$SH_2^{[(n-1)/2]}{}_{-2}$ are operated in a coordinated, inverse complimentary fashion so that a constant number of resistors equal to half of the combined number of resistors of strings 360 and 362 remain in series with the other resistors between terminals 102 and 104, and the other half of the combined number of resistors of strings 360 and 362 are bypassed, at the completion of a switching operation. For example, all of shunt switches $SH_0$–$SH_2^{[(n-1)/2]}{}_{-2}$ may be on, bypassing all of string 360, in which case all of shunt switches $SL_0$–$SL_2^{[(n-1)/2]}{}_{-2}$ will be off, so that all of string 362 remains in series with the other resistances between terminals 102 and 104. Conversely, all of shunt switches $SL_0$–$SL_2^{[(n-1)/2]}{}_{-2}$ may be on, bypassing all of string 362, in which case all of shunt switches $SH_0$–$SH_2^{[(n-1)/2]}{}_{-2}$ will be off, so that all of string 360 remains in series with the other resistances between terminals 102 and 104. Where some but not all of the shunt switches $SH_0$–$SH_2^{[(n-1)/2]}{}_{-2}$ are on, an equal number of shunt switches $SL_0$–$SL_2^{[(n-1)/2]}{}_{-2}$ will be off, and vice versa. However, the shunt switches of the first set of shunt switches $SH_0$–$SH_2^{[(n-1)/2]}{}_{-2}$ are operated in a inverted order with respect to those of the second set of shunt switches $SL_0$–$SL_2^{[(n-1)/2]}{}_{-2}$ i.e., the first shunt switch $SH_0$ of the first set of shunt switches $SH_0$–$SH_2^{[(n-1)/2]}{}_{-2}$ is operated in a complementary manner to the last shunt switch $SL_2^{[(n-1)/2]}{}_{-2}$ of the second set of shunt switches $SL_0$–$SL_2^{[(n-1)/2]}{}_{-2}$. Similarly, the second shunt switch $SH_1$ of the first set of shunt switches $SH_0$–$SH_2^{[(n-1)/2]}{}_{-2}$ is operated complementarily to the next to last shunt switch $SL_2^{[(n-1)/2]}{}_{-3}$ of the second set of shunt switches $SL_0$–$SL_2^{[(n-1)/2]}{}_{-1}$. Similarly, the last shunt switch $SH_2^{[(n-1)/2]}{}_{-2}$ of the first set of shunt switches $SH_0$–$SH_2^{[(n-1)/2]}{}_{-2}$ is operated complementarily to the first shunt switch $SL_0$ of the second set of shunt switches $SL_0$–$SL_2^{[(n-1)/2]}{}_{-2}$, and so on. In other words, when a subset of the first set of shunt switches $SH_0$–$SH_2^{[(n-1)/2]}{}_{-2}$ is switched on, so as to bypass a portion of string 360, then an inverse corresponding subset of the second set of shunt switches $SL_0$–$SL_2^{[(n-1)/2]}{}_{-2}$ are switched off, so as to leave an inverse portion of string 362 in series with the other resistors between end terminals 102 and 104. In this manner, a constant resistance is maintained between end terminals 102 and 104 due to strings 360 and 362 before and after a given switching operation to implement a newly input n-bit wiper address.

For example, in a situation where some of the shunt switches $SH_0$–$SH_2^{[(n-1)/2]}{}_{-2}$ are on, and some are off, the on shunt switches are a contiguous set beginning with shunt switch $SH_0$, and the off shunt switches are a contiguous set beginning with the next shunt switch after the last on shunt switch and extending through the last shunt switch $SH_2^{[(n-1)/2]}{}_{-2}$. At the same time, the number of shunt switches $SL_0$–$SL_2^{[(n-1)/2]}{}_{-2}$ that are off will equal the number of shunt switches $SH_0$–$SH_2^{[(n-1)/2]}{}_{-2}$ that are on, and the number of shunt switches $SL_0$–$SL_2^{[(n-1)/2]}{}_{-2}$ that are on will equal the number of shunt switches $SH_0$–$SH_2^{[(n-1)/2]}{}_{-2}$ that are off; however, the off shunt switches of shunt switches $SL_0$–$SL_2^{[(n-1)/2]}{}_{-2}$ are contiguous set beginning at last shunt switch $SL_2^{[(n-1)/2]}{}_{-2}$ and the on shunt switches of shunt switches $SL_0$–$SL_2^{[(n-1)/2]}{}_{-2}$ are a continuous set beginning with the next shunt switch after the last off shunt switch and extending through first shunt switch $SL_0$.

To ensure complementary operation of shunt switches $SH_0$–$SH_2^{[(n-1)/2]}{}_{-2}$ versus shunt switches $SL_0$–$SL_2^{[(n-1)/2]}{}_{-2}$ the switch control logic block 228 may provide the buffer 226 associated with shunt switches $SL_0$–$SL_2^{[(n-1)/2]}{}_{-2}$ with a control signal that is complimentary to that provided to the buffer 226 associated with shunt switches $SH_0$–$SH_2^{[(n-1)/2]}{}_{-2}$. Alternatively, shunt switches $SH_0$–$SH_2^{[(n-1)/2]}{}_{-2}$ and shunt switches $SL_0$–$SL_2^{[(n-1)/2]}{}_{-2}$ may be of opposite types, so that a same control signal provided to shunt switches $SH_0$–$SH_2^{[(n-1)/2]}{}_{-2}$ and shunt switches $SL_0$–$SL_2^{[(n-1)/2]}{}_{-2}$ via lines 367 and 369, respectively, will provide the desired complimentary configurations.

Bulk resistor $R_B$ 302 is coupled between end node 357 of string 360 and terminal 102. Shunt switching device 310 is coupled in parallel with bulk resistor $R_B$ 302 between node 357 and end terminal 102. When switching device 310 is on, bulk resistor $R_B$ 302 is bypassed. When switching device 310 is off, bulk resistor bulk resistor $R_B$ 302 is in series with other resistors between terminals 102 and 104.

Bulk resistor $R_B$ 304 is coupled between end node 363 of string 362 and terminal 104. Switching device 312 is coupled in parallel with bulk resistor $R_B$ 304 between node 363 and end terminal 104. When switching device 312 is on, bulk resistor $R_B$ 304 is bypassed. When switching device 312 is off, bulk resistor $R_B$ 304 is in series with other resistors between terminals 102 and 104.

The resistance of each of bulk resistors $R_B$ 302 and $R_B$ 304 is $2^{n-1}$ times the resistance of one of the elemental resistors $R_0$–$R_2^{[n/2]}{}_{-2}$, or one elemental resistor value greater than the combined resistance of string 364 and one of strings 360 and 362.

Shunt switches 310 and 312 are operated by switch control logic block 228 in a complementary fashion, such that when switching device 310 is on, switching device 312 is off, and vice versa. Accordingly, only one of bulk resistors 310 and 312 remains in series between terminals 102 and 104 after any given switching sequence. To ensure complementary operation of switching devices 310 and 312, the switch control logic block 228 may provide switching device 312 with a control signal complimentary to that provided to switching device 310. Alternatively, switching devices 310 and 312 may be of opposite types, so that the same control signal provided to switching devices 310 and 312 will provide the complimentary configurations. Alternatively, the respective buffer 226 may provide switching devices 310 and 312 with a pair of complementary signals based on an input signal from switch control logic block 228.

In one embodiment, the switch control logic block 228 may control the wiper switches $S_0$–$S_2^{[n/2]}{}_{-2}$, shunt switches $SH_0$–$SH_2^{[(n-1)/2]}{}_{-2}$ and $SL_0$–$SL_2^{[(n-1)/2]}{}_{-2}$, and switching devices 310 and 312 using different subportions of an input n-bit wiper address. For instance, switch control logic block 228 may use the MSB of the input n-bit wiper address to control switching devices 310 and 312. Switch control logic block 228 may use the next lesser intermediate [(n−1)/2] bits of the n-bit wiper address below the MSB to control shunt switches $SH_0$–$SH_2^{[(n-1)/2]}{}_{-2}$ and $SL_0$–$SL_2^{[(n-1)/2]}{}_{-2}$. Finally, switch control logic block 228 may use the remaining, lesser bits [n/2] of the n-bit wiper address to control wiper switches $S_0$–$S_2^{[n/2]}{}_{-1}$. An equation for the apportionment of the n-bit wiper address amongst the three stages of digital potentiometer 350 is set forth in Equation 1 below, $$n = [n/2] + [(n-1)/2] + 1 \qquad \text{Equation 1}$$

where n is the number of bits in the wiper address, [n/2] is the number of bits used for controlling wiper switches $S_0$–$S_2^{[n/2]}{}_{-1}$, [(n−1)/2] is the number of bits used for controlling shunt switches $SH_0$–$SH_2^{[(n-1)/2]}{}_{-2}$ and $SL_0$–$SL_2^{[(n-1)/2]}{}_{-2}$, and the remaining one bit, i.e., the MSB, is used for controlling switching devices 310 and 312.

Practitioners will appreciate that digital potentiometer 350 significantly reduces the number of components necessary to implement the same number of wiper positions as the conventional digital potentiometer of FIG. 1. Rather than requiring the $2^n-1$ elemental resistors and $2^n$ wiper switches of digital potentiometer 100, digital potentiometer 350 requires only: (1) one string 364 of $2^{[n/2]}{}_{-1}$ elemental resistors $R_0$–$R_2^{[n/2]}{}_{-2}$; (2) $2^{[n/2]}$ wiper switches $S_0$–$S_2^{[n/2]}{}_{-1}$; (3) two strings 360, 362 of $2^{[(n-1)/2]}-1$ intermediate-resistance resistors $RH_0$–$RH_2^{[(n-1)/2]}{}_{-2}$ and $RL_0$–$RL_2^{[(n-1)/2]}{}_{-2}$, with each resistor having a resistance value equal to $2^{[n/2]}$ times the resistance of one of the elemental resistors; (4) two sets of $2^{[(n-1)/2]}-1$ shunt switches $SH_0$–$SH_2^{[(n-1)/2]}{}_{-2}$ and $SL_0$–$SL_2^{[(n-1)/2]}{}_{-2}$; (5) two large resistance bulk resistors $R_B$ 302 and $R_B$ 304 each having a resistance value of $2^{n-1}$ times one of the elemental resistors; (6) two switching devices 310 and 312 each operable to bypass the associated one of the bulk resistors $R_B$ 302 and $R_B$ 304; and (7) two dummy structures 356 and 358.

As an example, assume that digital potentiometer 350 has 256 wiper positions accessed using an eight bit (n=8) wiper address. In such a case, the configuration of digital potentiometer 350 would include: (1) fifteen elemental resistors $R_0$–$R_2^{[n/2]}{}_{-2}$; (2) sixteen wiper switches $S_0$–$S_2^{[n/2]}{}_{-1}$; (3) seven intermediate-resistance resistors $RH_0$–$RH_2^{[(n-1)/2]}{}_{-2}$ each having a resistance value approximately sixteen times the resistance of one of the elemental resistors $R_0$–$R_2^{[n/2]}{}_{-2}$; (4) seven shunt switches $SH_0$–$SH_2^{[(n-1)/2]}{}_{-2}$; (5) seven intermediate-resistance resistors $RL_0$–$RL_2^{[(n-1)/2]}{}_{-2}$ each having a resistance value approximately sixteen times the resistance of one of the elemental resistors $R_0$–$R_2^{[n/2]}{}_{-1}$; (6) seven shunt switches $SL_0$–$SL_2^{[(n-1)/2]}{}_{-2}$; (7) one bulk resistor $R_B$ 302 having a resistance value approximately 128 times one of the elemental resistors; (8) one switching device 310; (9) one bulk resistor $R_B$ 304 having a resistance value approximately 128 times one of the elemental resistors; (10) one switching device 312; and (11) two dummy structures 356 and 358. In other words, there are 31 resistors, 32 switches, and two dummy structures, which in one embodiment may each include one further resistor and one further switch, for a total of 33 resistors and 34 switches. This amounts to a significant reduction (approximately 80%) in the number of components necessary to implement the same number of wiper positions (256) as provided by conventional digital potentiometer 100 of FIG. 1.

As mentioned, switch logic control block 228 may use different portions of an input n-bit wiper address for controlling the wiper switches $S_0$–$S_2^{[n/2]}{}_{-1}$, shunt switches $SH_0$–$SH_2^{[(n-1)/2]}{}_{-2}$ and $SL_0$–$SL_2^{[(n-1)/2]}{}_{-2}$, and switching devices 310 and 312. Where, continuing with the above example, an eight bit wiper address (n=8) is used, switch control logic block 228 of digital potentiometer 350 may use: (1) the MSB (bit 7) of an eight bit wiper address to control switching devices 310 and 312; (2) the next lesser three bits (bits 6–4) to control shunt switches $SH_0$–$SH_2^{[(n-1)/2]}{}_{-2}$ and $SL_0$–$SL_2^{[(n-1)/2]}{}_{-2}$; and (3) the remaining lesser four bits (bits 3–0) to control wiper switches $S_0$–$S_2^{[n/2]}{}_{-1}$.

As mentioned above, dummy structures 356 and 358 are provided in strings 360 and 362, respectively, of digital potentiometer 350. In particular, dummy structure 356 is coupled to and between end node 357 and first resistor $RH_0$ of string 360. Dummy structure 358 is coupled to and between end node 363 and first resistor $RL_0$ of string 362.

In one embodiment, dummy structures 356 and 358 each contain a resistor in parallel with a permanently "on" switch built like one of shunt switches $SH_0$–$SH_2^{[(n-1)/2]}{}_{-2}$ and $SL_0$–$SL_2^{[(n-1)/2]}{}_{-2}$. The resistor value and the switch characteristics of the dummy structure 356, 358 provide a constant equivalent resistance of the parasitical series resistor of the whole stage. For instance, dummy structures 356 and 358 may serve to compensate for the on-resistance of shunt switches $SH_0$–$SH_2^{[(n-1)/2]}{}_{-2}$ and $SL_0$–$SL_2^{[(n-1)/2]}{}_{-2}$, respectively, which, if not compensated for, could cause non-linear performance after every $2^{[n/2]}$ position of the wiper address range of multi-stage digital potentiometer 350. Obviously, the closer shunt switches $SH_0$–$SH_2^{[(n-1)/2]}{}_{-2}$ and $SL_0$–$SL_2^{[(n-1)/2]}{}_{-2}$ come to an ideal short, the lesser the need for dummy structures 356 and 358. If non-linearity is not a significant concern, then dummy structures 356, 358 may be omitted.

Figure 5:
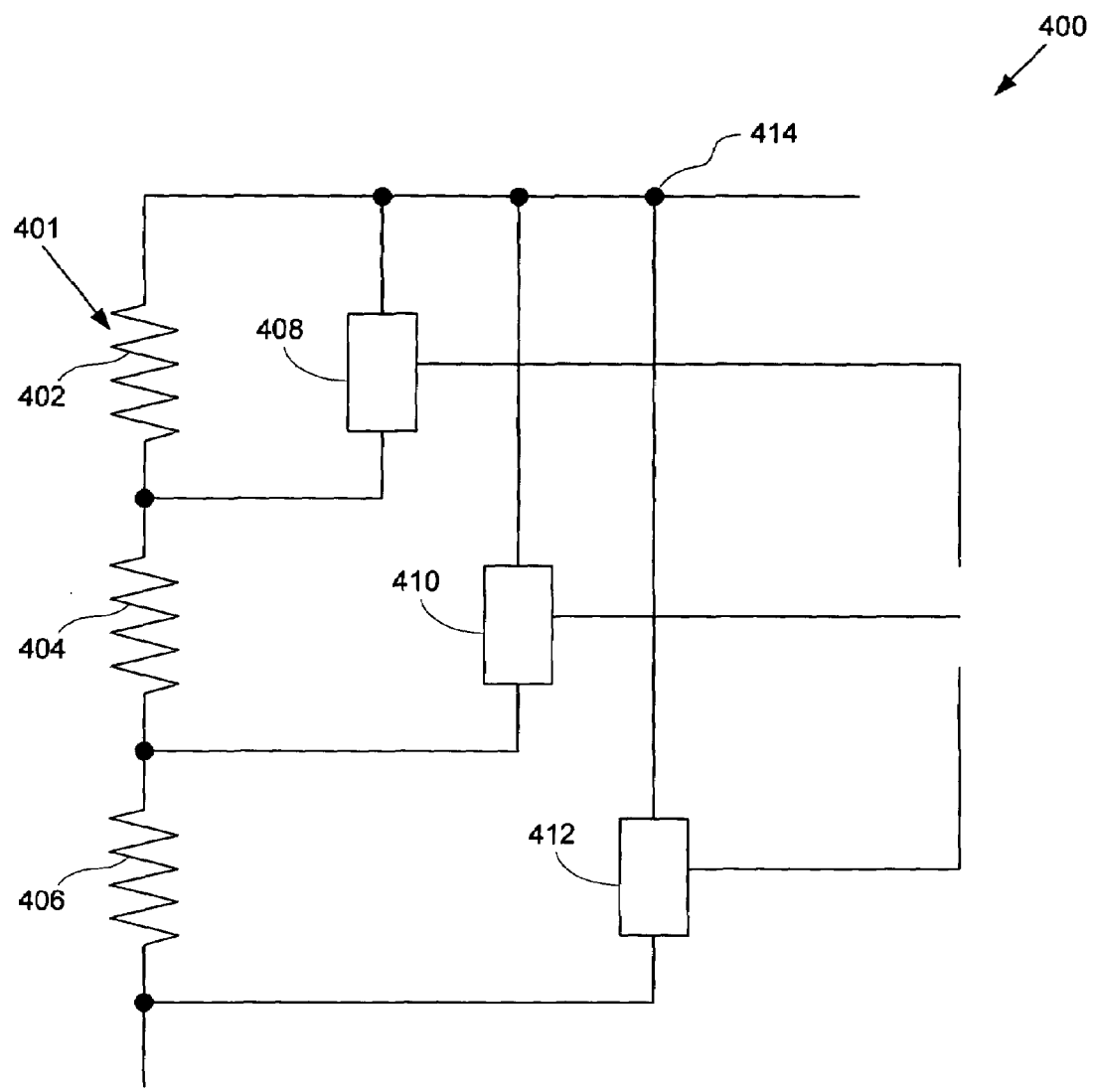
FIG. 5 is a schematic diagram of part of a string of shunted resistors.

The function and structure of dummy structures 356 and 358 may be understood by resort to FIG. 5, which shows a portion of a shunted resistor structure 400. Only three resistors 402, 404, and 406 of resistor string 401 are shown for the simplicity of the figure, but there may be any number of shunted resistors. Initially, assume that each of resistors 402, 404, and 406 has the same resistance, R. Three identical shunt switches 408, 410, and 412 are coupled between an end node 414 of resistor string 401 and an internal node of resistor string 401. In particular, shunt switch 408 has a first terminal coupled to end node 414 and a second terminal coupled between resistors 402 and 404; shunt switch 410 has a first terminal coupled to end node 414 and a second terminal coupled between resistors 404 and 406; and shunt switch 412 has a first terminal coupled to end node 414 and a second terminal coupled between resistors 402 and a next resistor (not shown) of the resistor string 401 (or an end node of the resistor string 401). Each of shunt switches 408, 410, and 412 has an identical on-resistance, RS. When shunt switch 408 is on, resistor 402 is bypassed. When shunt switch 410 is on too, resistors 402 and 404 are bypassed. Finally, when shunt switch 412 is also on, resistors 402, 404, and 406 are bypassed.

In operation, in order to obtain good relative linearity of the resistance string 401, the bypassed zone of string 401 should have the same equivalent resistance regardless of which shunt switch 408, 410, and 412 is on. Accordingly, the following relation applies, where "||" means in parallel.

$$RS_{408}\|R_{402} = RS_{410}\|(R_{404}+RS_{408}\|R_{402}) = RS_{412}\|(R_{406}+ RS_{410}\|(R_{404}+RS_{408}\|R_{402}))= RS_n\|(R_n+RS_{n-1}\|(\ldots)\ldots)$$

From these relations it can be seen that the first switch 408 should be permanently on. So, the first group, $R_{402}\|R_{408}$, in the FIG. 5 structure should be a dummy structure that includes a resistor in parallel with a permanently "on" shunt switch built like shunt switches 410 and 412.

A possibility to decrease further the built-in non-linearity error inherent in the multistage shunted architecture depicted in FIG. 5 is to modify the shunt resistor connected in parallel with the permanently-on dummy switch in accordance with the following equation:

$$R_{402} = \frac{R + \sqrt{R(R+4RS)}}{2} \qquad \text{Equation 2}$$

where R is the resistance of resistors 404 and 406 and RS is the on-resistance of the shunt switches 408, 410, and 412. These calculations are made ignoring the dependence of the switch on-resistance versus the supply voltage and reference voltages $V_{REF+}$ and $V_{REF-}$. The above values could be obtained when the to reference voltages $V_{REF+}$ and $V_{REF-}$ values are Vcc and ground, respectively, because all switches are working at the supply limits and their equivalent on-resistance is almost the same.

Therefore, with respect to digital potentiometer 350 of FIG. 4, dummy structures 356 and 358 each include a resistor in parallel with a permanently-on shunt switch built like shunt switches $SH_0$–$SH_2^{[(n-1)/2]}{}_{-2}$ and $SL_0$–$SL_2^{[(n-1)/2]}{}_{-2}$. Further, the resistance of the dummy resistor of dummy structures 356 and 358 may be calculated according to Equation 2 above, where R is equal to the resistance of one of the intermediate-resistance resistors $RH_0$–$RH_2^{[(n-1)/2]}{}_{-2}$ and $RL_0$–$RL_2^{[(n-1)/2]}{}_{-2}$, and RS is the on-resistance of the shunt switches $SH_0$–$SH_2^{[(n-1)/2]}{}_{-2}$ and $SL_0$–$SL_2^{[(n-1)/2]}{}_{-2}$. Alternatively, the value of the resistor of dummy structures 356, 358 may be the same as the resistance of one of resistors $RH_0$–$RH_2^{[(n-1)/2]}{}_{-2}$ and $RL_0$–$RL_2^{[(n-1)/2]}{}_{-2}$.

Readers will appreciate that the switching sequences and algorithms employed in digital potentiometer 350, such as whether MBB, BBM, or combinations of MBB and BBM sequences are used, can vary, depending on the application, as discussed above with respect to digital potentiometer 200.

The following examples are provided to illustrate the operation of digital potentiometer 350 of FIG. 4.

EXAMPLE 5

In this example, digital potentiometer 350 will start at a lowest output voltage position, e.g., with an output voltage $V_w$ at the wiper terminal 106 equal to reference voltage $V_{REF-}$ (e.g., ground), and will incrementally increase the output voltage $V_w$ to a highest output voltage position, e.g., with an output voltage $V_w$ at the wiper terminal 106 equal to reference voltage $V_{REF+}$ (e.g., 5 V). For ease of explanation, switch configurations are discussed in terms of their states "before" and "after" the switching operation, and not in terms of their states during the switching operation.

At the lowest output voltage position, digital potentiometer 350 has a configuration with: (1) switching device 312 on so as to bypass bulk resistor $R_B$ 304 and connect the end node 363 to end terminal 104, which is coupled to the low reference voltage $V_{REF-}$; (2) shunt switches $SL_0$–$SL_2^{[(n-1)/2]}{}_{-1}$ are all on as to bypass all of the resistors of string 362; (3) wiper switch $S_0$ is on so that string 364 is tapped between node 365 and resistor $R_0$, and the other wiper switches $S_1$–$S_2^{[n/2]}{}_{-1}$ are off; (4) shunt switches $SH_0$–$SH_2^{[(n-1)/2]}{}_{-2}$ are all off, complementary to shunt switches $SL_0$–$SL_2^{[(n-1)/2]}{}_{-2}$, thereby placing string 360 in series with string 364 between terminals 102 and 104; and (5) the switching device 310 off so that bulk resistor $R_B$ 302 is coupled between end node 357 and terminal 102, which is coupled to the high reference voltage $V_{REF+}$, and in series with strings 360 and 364.

From this lowest output voltage position, the output voltage $V_w$ at wiper terminal 106 may be incrementally increased by providing successive input signals 230 with incremented wiper addresses. In response, switch control logic block 228 increments the identity of the single turned-on-one of the wiper switches from switch $S_0$ to switch $S_1$, from switch $S_1$ to switch $S_2$, and so on through last wiper switch $S_2^{[n/2]}{}_1$, while leaving switching device 310 off, switching device 312 on, all of shunt switches $SL_0$–$SL_2^{[(n-1)/2]}{}_{-2}$ on, and all of shunt switches $SH_0$–$SH_2^{[(n-1)/2]}{}_{-2}$ off. For instance, when switch $S_1$ is turned on, the output voltage $V_w$ at the wiper terminal 106 is a function of the resistance of resistor $R_0$. When last switch $S_2^{[n/2]}{}_1$, is turned on, the output voltage $V_w$ at the wiper terminal 106 is a function of the sum of the resistance of all of resistors $R_0$–$R_2^{[n/2]}{}_{-2}$ of string 364.

To further increment the output voltage $V_w$ beyond that associated with the sum of resistors $R_0$–$R_2^{[n/2]}{}_{-2}$ of string 364, a process is begun of changing the configurations of the shunt switches $SH_0$–$SH_2^{[(n-1)/2]}{}_{-2}$ and $SL_0$–$SL_2^{[(n-1)/2]}{}_{-2}$ in a coordinated, inverse complementary fashion. In particular, one resistor of string 362 beginning at node 365 is put in series with the other resistance values between end terminals 102 and 104, and one resistor of string 360 beginning at node 357 is bypassed. Hence, the configuration of digital potentiometer 350 is initially changed so that: (1) last shunt switch $SL_2^{[(n-1)/2]}{}_{-2}$ of the second set of shunt switches $SL_0$–$SL_2^{[(n-1)/2]}{}_{-2}$ is off, thereby putting the last resistor $RL_2^{[(n-1)/2]}{}_{-2}$ of string 362 in series between terminals 102 and 104; (2) shunt switch $SH_0$ is on, bypassing resistor $RH_0$ and dummy structure 356; (3) the remaining shunt switches $SL_0$–$SL_2^{[(n-1)/2]}{}_{-3}$ of the second set of shunt switches remain on and shunt switches $SH_1$–$SH_2^{[(n-1)/2]}{}_{-2}$ of the first set of shunt switches remain off; (4) switching device 312 remains on and switching device 310 remains off; and (5) wiper switch $S_0$ alone is on. Accordingly, the output voltage $V_w$ at the wiper terminal 106 is a function of the resistance of resistor $RL_2^{[(n-1)/2]}{}_{-2}$. As mentioned, the resistance of one of the intermediate-resistance resistors $RL_0$–$RL_2^{[(n-1)/2]}{}_{-2}$ is $2^{[n/2]}$ times the resistance of one of the $2^{[n/2]}-1$ elemental resistors $R_0$–$R_2^{[n/2]}{}_{-2}$ of string 364, or one elemental resistance greater than the combined resistance of elemental resistors $R_0$–$R_2^{[n/2]}{}_{-2}$ of string 364. Hence, an increment of one elemental resistance value is accomplished by this configuration, resulting in a corresponding increment in the output voltage Vw at the wiper terminal 106 by one voltage unit.

Further increments in the output voltage $V_w$ may then be obtained by incrementing the single-turned-on-one of the wiper switches $S_0$–$S_2^{[n/2]}{}_{-1}$ until the last wiper switch $S_2^{[n/2]}{}_{-1}$ is the single turned-on-one of the wiper switches. At such point, the output voltage $V^w$ at wiper terminal 106 is a function of the resistance of resistor $RL_2^{[(n-1)/2]}{}_{-2}$ and all of the elemental resistors $R_0$–$R_2^{[n/2]}{}_{-2}$ of string 364.

To further increment the output voltage $V_w$ beyond that associated with resistor $RL_2^{[(n-1)/2]}{}_{-2}$ and string 364, the configurations of the sets of shunt switches $SH_0$–$SH_2^{[(n-1)/2]}{}_{-2}$ and $SL_0$–$SL_2^{[(n-1)/2]}{}_{-2}$ must again be changed in an inverse, complementary fashion. This time, the configuration of digital potentiometer 350 is changed so that: (1) the next to last and last shunt switches $SL_2^{[(n-1)/2]}{}_{-3}$ and $SL_2^{[(n-1)/2]}{}_{-2}$ respectively, of the second set of shunt switches $SL_0$–$SL_2^{[(n-1)/2]}{}_{-2}$ are off, thereby putting the last two resistors $RL_2^{[(n-1)/2]}{}_{-3}$ and $RL_2^{[(n-1)/2]}{}_{-2}$ of string 362 in series with the other resistances between terminals 102 and 104; (2) shunt switches $SH_0$ and $SH_1$ are on, bypassing resistors $RH_0$ and $RH_1$ and dummy structure 356 of string 360; (3) the remaining shunt switches $SL_0$–$SL_2^{[(n-1)/2]}{}_{-4}$ of the second set of shunt switches remain on and the remaining shunt switches $SH_2$–$SH_2^{[(n-1)/2]}{}_{-2}$ of the first set of shunt switches remain off; (4) switching device 312 remains on and switching device 310 remains off; and (5) wiper switch $SL_0$ alone among the wiper switches is on. Accordingly, the output voltage $V_w$ at the wiper terminal 106 is a function of the combined resistance of resistors $RL_2^{[(n-1)/2]}{}_{-3}$ and $RL_2^{[(n-1)/2]}{}_{-2}$ of string 362, which is one elemental resistance value greater than the combined resistance of the prior configuration of last resistor $RL_2^{[(n-1)/2]}{}_{-2}$ of string 362 and all of elemental resistor string 364.

Further increments in the output voltage $V_w$ may then be obtained by sequentially repeating the processes of incrementing the single-turned one of wiper switches $S_0$–$S_2^{[n/2]}{}_{-1}$, decrementing the turned-off ones of shunt switches $S_0$–$SL_2^{[(n-1)/2]}{}_{-2}$, and complimentarily incrementing the turned-on ones of shunt switches $SH_0$–$SH_2^{[(n-1)/2]}{}_{-2}$, as described above. Ultimately, a configuration will be reached at the middle of the resistance range of digital potentiometer 350 where switching device 312 is on, switching device 310 is off, all of shunt switches $SL_0$–$SL_2^{[(n-1)/2]}{}_{-2}$ are off, all of shunt switches $SH_0$–$SH_2^{[(n-1)/2]}{}_{-2}$ are on, and the last wiper switch $S_2^{[n/2]}{}_{-1}$ is the single turned-on-one of the wiper switches wiper switches $S_0$–$S_2^{[n/2]}{}_{-1}$. At such a point, the voltage at the wiper terminal 106 is a function of the combined resistance of all of the resistors of strings 362 and 364.

To further increment the output voltage $V_w$ at wiper terminal 106 beyond that associated with strings 362 and 364, a process of changing the configurations of switching devices 310 and 312 in a complementary fashion is begun, similar to that described above for digital potentiometer 300 of FIG. 3. In particular, the configuration of digital potentiometer 350 is changed so that: (1) switching device 312 is off, so that bulk resistor $R_B$ 304 is in series with the other resistors between terminals 102 and 104; (2) switching device 310 is on, so that bulk resistor $R_B$ 302 is bypassed; (3) all of shunt switches $SL_0$–$SL_2^{[(n-1)/2]}{}_{-2}$ are on, so that string 362 is bypassed; (4) all of shunt switches $SH_0$–$SH_2^{[(n-1)/2]}{}_{-2}$ are off, so that string 360 is in series with the other resistors between terminals 102 and 104; and (4) the first wiper switch $S_0$ is the single turned-on-one of the wiper switches $S_0$–$S_2^{[n/2]}{}_{-1}$. Accordingly, the output voltage $V_w$ at the wiper terminal 106 is a function of the resistance of only bulk resistor $R_B$ 304. Since bulk resistor $R_B$ 304 has a resistance of $2^{n-1}$ times one of the elemental resistors of string 364, or one elemental resistance value greater than the combined resistance of all of the resistors of strings 362 and 364, switching to this configuration increments the output voltage $V_w$ at the wiper terminal 106 by one voltage unit.

Further increments in the output voltage $V_w$ beyond that associated with bulk resistor $R_B$ 304 may then be obtained by sequentially repeating the processes of incrementing the single-turned one of wiper switches $S_0$–$S_2^{[n/2]}{}_{-1}$, decrementing the turned-off ones of shunt switches $SL_0$–$SL_2^{[(n-1)/2]}{}_{-2}$, and complimentarily incrementing the turned-on ones of shunt switches $SH_0$–$SH_2^{[(n-1)/2]}{}_{-2}$, as described above. Ultimately, a configuration is reached where the output voltage $V_w$ at wiper terminal 106 is a maximum, at which point the configuration of digital potentiometer 350 is: (1) switching device 312 is off, so that bulk resistor $R_B$ 304 is in series with the other resistors between terminals 102 and 104; (2) switching device 310 is on, so that bulk resistor $R_B$ 302 is bypassed; (3) all of shunt switches $SL_0$–$SL_2^{[(n-1)/2]}{}_{-2}$ are off, so that string 362 is in series between terminals 102 and 104; (4) all of shunt switches $SH_0$–$SH_2^{[(n-1)/2]}{}_{-2}$ are on, so that string 360 is bypassed; and (5) the last wiper switch $S_2^{[n/2]}{}_{-1}$, is the single turned-on-one of the wiper switches $S_0$–$S_2^{[n/2]}{}_{-1}$. Accordingly, the output voltage $V_w$ at the wiper terminal 106 is a function of the combined resistance of bulk resistor $R_B$ 304 and strings 362 and 364. The switching sequences used may vary.

EXAMPLE 6

In this example, digital potentiometer 350 will start at a particular output voltage position, and will change to another output voltage position in a non-incremental fashion. Assume an initial configuration in the lower half of the resistance range of digital potentiometer 350 where: (1) the switching device 310 is off, so that bulk resistor $R_B$ 302 is in series with the other resistors between terminals 102 and 104; (2) switching device 312 is on, so that bulk resistor $R_B$ 304 is bypassed and end node 363 is coupled to terminal 104; (3) last shunt switch $SL_2^{[(n-1)/2]}{}_{-2}$ of the second set of shunt switches $SL_0$–$SL_2^{[(n-1)/2]}{}_{-2}$ is off and the remaining shunt switches $SL_0$–$SL_2^{[(n-1)/2]}{}_{-3}$ are on, so that last resistor $RL_2^{[(n-1)/2]}{}_{-2}$ of string 362 is in series with the other resistances between terminals 102 and 104 and the remaining resistors $RL_0$–$RL_2^{[(n-1)/2]}{}_{-3}$ and dummy structure 358 are bypassed; (4) shunt switch $SH_0$ of the first set of shunt switches $SH_0$–$SH_2^{[(n-1)/2]}{}_{-2}$, and is on and the remaining shunt switches $SH_1$–$SH_2[(n-1)/2]_{-2}$ are off, so that resistor $RH_0$ and dummy structure 356 of string 360 are bypassed and the remaining resistors $RH_1$–$RH_2^{[(n-1)/2]}{}_{-2}$ are in series with the other resistances between terminals 102 and 104; and (5) wiper switch $S_2$ is the single turned-on-one of the wiper switches $S_0$–$S_2^{[n/2]}{}_{-1}$. Accordingly, the output voltage $V_w$ at the wiper terminal 106 would be a function of the last resistor $RL_2^{[(n-1)/2]}{}_{-2}$ of string 362 and elemental resistors $R_0$ and $R_1$.

Assume that an input signal 230 including an n-bit wiper address is then received by switch control logic block 228 that requires an increase in the output voltage $V_w$ at the wiper terminal 106 to a level in the upper half of the resistance range of digital potentiometer 350, e.g., to a level corresponding to the resistance of bulk resistor RB 304, all but one resistor of string 362, and all of string 364.

To implement such an output voltage $V_w$, switch control logic 228 would change the configuration of digital potentiometer 350 so that: (1) the switching device 312 is off, so that bulk resistor $R_B$ 304 is in series with the other resistors between terminals 102 and 104; (2) switching device 310 is on, so that bulk resistor $R_B$ 302 is bypassed and end node 357 is effectively coupled to terminal 102; (3) shunt switch $SL_0$ alone of the second set of shunt switches $SL_0$–$SL_2^{[(n-1)/2]}{}_{-2}$ is on and the remaining shunt switches $SL_1$–$SL_2^{[(n-1)/2]}{}_{-2}$ are off, so that resistor $RL_0$ and dummy structure 358 of string 362 are bypassed and resistors $RL_1$–$RL_2^{[(n-1)/2]}{}_{-2}$ are in series with the other resistances between terminals 102 and 104; (4) shunt switches $SH_0$–$SH_2^{[(n-1)/2]}{}_{-2}$ the first set of shunt switches $SH_0$–$SH_2^{[(n-1)/2]}{}_{-2}$ is are on so that resistors $RL_0$–$RL_2^{[(n-1)/2]}{}_{-3}$ of string 360 are bypassed and last shunt switch $SH_2^{[(n-1)/2]}{}_{-1}$ is off so that the last resistor $RH_2^{[(n-1)/2]}{}_{-2}$ is in series with the other resistors between terminals 102 and 104; and (5) the last wiper switch $S_2^{[n/2]}{}_{-1}$ is the single turned-on-one of the wiper switches $S_0$–$S_2^{[n/2]}{}_{-1}$. The sequence of the switching may vary as described above with respect to digital potentiometer 200. For instance, a BBM switching sequence may be used.

Figure 6:
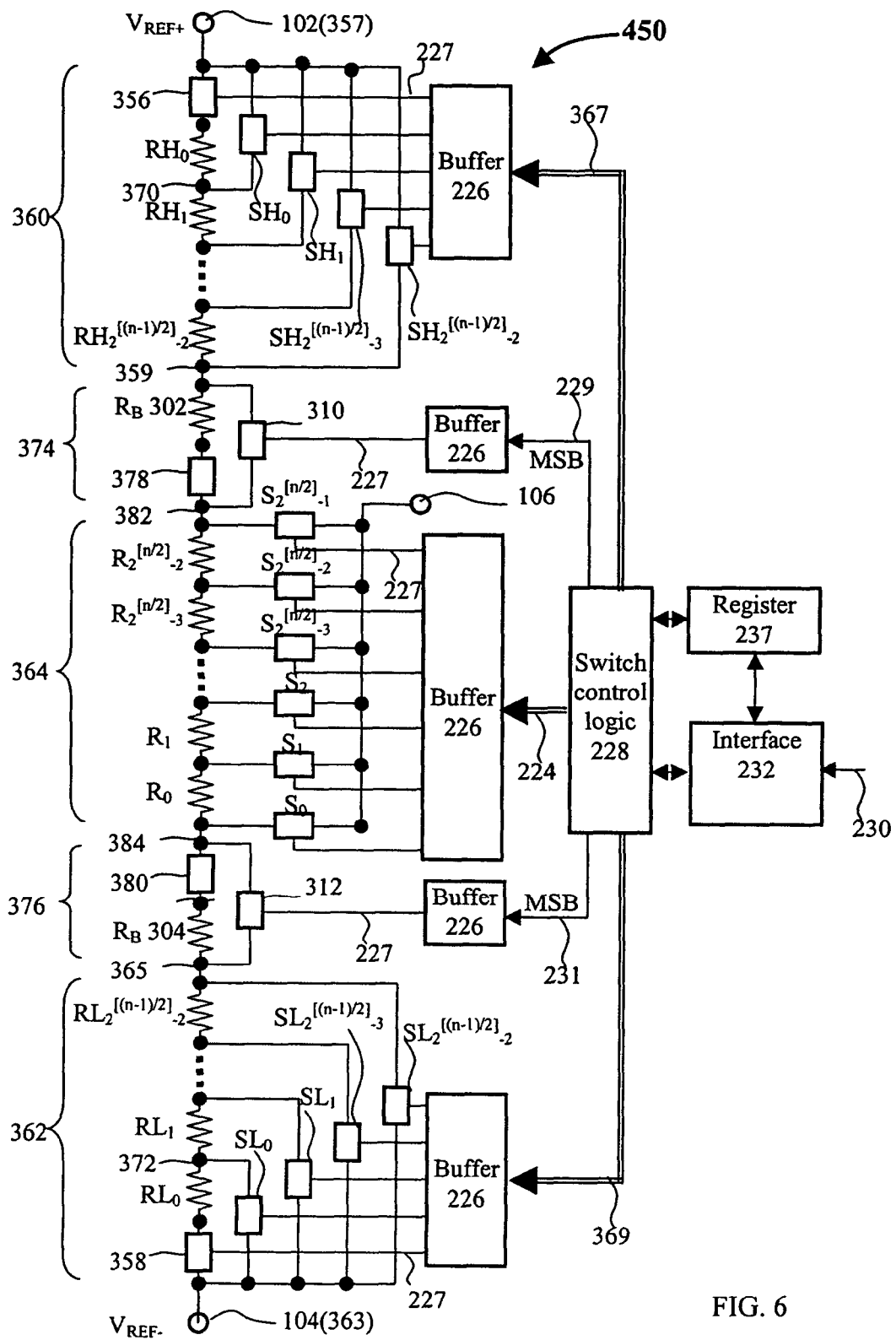
FIG. 6 is a schematic diagram of a digital potentiometer in accordance with a fourth exemplary embodiment of the present invention.

FIG. 6 illustrates a digital potentiometer 450 in accordance with a fourth embodiment of the present invention. The digital potentiometer 450 is similar in certain respects with digital potentiometer 350 of FIG. 4, and includes many of the same reference numbers and features.

Like digital potentiometer 350, digital potentiometer 450 includes: (1) one string 364 of $2^{[n/2]}-1$ elemental resistors $R_0$–$R_2^{[n/2]}{}_{-2}$ in series; (2) $2^{[n/2]}$ wiper switches $S_0$–$S_2^{[n/2]}{}_{-1}$; (3) two mirror image strings 360 and 362 of $2^{[(n-1)/2]}-1$ series intermediate-resistance resistors $RH_0$–$RH_2^{[(n-1)/2]}{}_{-2}$ and $RL_0$–$RL_2^{[(n-1)/2]}{}_{-2}$, with each resistor having a resistance value equal to $2^{[n/2]}$ times the resistance of one of the elemental resistors; (4) two mirror image sets of $2^{[(n-1)/2]}$ shunt switches $SH_0$–$SH_2^{[(n-1)/2]}{}_{-2}$ and $SL_0$$SL_2^{[(n-1)/2]}{}_{-2}$ associated with strings 360 and 362, respectively; (5) two large resistance bulk resistors $R_B$ 302 and $R_B$ 304 each having a resistance value of $2^{n-1}$ times one of the elemental resistors; (6) two switching devices 310 and 312 each operable to bypass an associated one of the bulk resistors $R_B$ 302 and $R_B$ 304; and (7) two dummy structures 356 and 358. However, digital potentiometer 450 includes two additional dummy structures and has a different arrangement of the structures between terminals 102 and 104.

In particular, in digital potentiometer 450, bulk resistor $R_B$ 302 is part of a bulk structure 374 that is disposed between a first end of string 364 and string 360. Bulk structure 374 also includes a dummy structure 378 that is in series with bulk resistor $R_B$ 302, and a switching device 310. A first end of bulk resistor $R_B$ 302 is coupled to last resistor $RH_2^{[(n-1)/2]}{}_{-2}$ of string 360 and last shunt switch $SH_2^{[(n-1)/2]}{}_{-2}$ at node 359. An opposite second end of bulk resistor $R_B$ 302 is coupled to a first end of dummy structure 378. An opposite second end of dummy structure 378 is coupled to the last elemental resistor $R_2^{[n/2]}{}_{-2}$ of string 364 and the last wiper switch $S_2^{[n/2]}{}_{-1}$ at node 382. Switching device 310 is coupled in parallel with the series of bulk resistor $R_B$ 302 and dummy structure 378 between nodes 359 and 382. Switching device 310 is operable to bypass bulk resistor $R_B$ 302 and dummy structure 378 in response to a MSB-based input from switch control logic block 228 received via buffer 226 and lines 229 and 227. Dummy structure 378 includes a permanently-on switch like switch 310, and a resistor whose resistance is calculated according to Equation 2 above. An end of dummy structure 356 of string 360 is coupled to terminal 102. Note that common node 357 of digital potentiometer 350 of FIG. 4 is subsumed into terminal 102 in digital potentiometer 450 of FIG. 6, as indicated by the notation "102(357)."

Similarly, bulk resistor $R_B$ 304 is part of a bulk structure 376 that is disposed between a second end of string 364 and string 362. Bulk structure 376 also includes a dummy structure 380 in series with bulk resistor $R_B$ 304, and a switching device 312. A first end of bulk resistor $R_B$ 304 is coupled to the last resistor $RL_2^{[(n-1)/2]}{}_{-2}$ of string 362 and the last shunt switch $SL_2^{[(n-1)/2]}{}_{-2}$ at node 365. An opposite second end of bulk resistor $R_B$ 304 is coupled to a first end of dummy structure 380. An opposite second end of dummy structure 380 is coupled to the first elemental resistor $R_0$ of string 364 and the first wiper switch $S_0$ at node 384. Switching device 312 is coupled in parallel with the series of bulk resistor $R_B$ 304 and dummy structure 380 between nodes 365 and 384. Switching device 312 is operable to bypass bulk resistor $R_B$ 304 and dummy structure 380 in response to a MSB-based input from switch control logic block 228 received via buffer 226 and lines 231 and 227. Dummy structure 380 includes a permanently-on switch like switch 312, and a resistor whose resistance is calculated according to Equation 2 above. An end of dummy structure 358 of string 362 is coupled to terminal 104. Note that common node 363 of digital potentiometer 350 of FIG. 4 is subsumed into terminal 104 in digital potentiometer 450 of FIG. 6, as indicated by the notation "104(363)."

As with digital potentiometer 350 of FIG. 4, digital potentiometer 450 of FIG. 6 is symmetrical around elemental resistor string 364. Bulk structure 374 is a mirror image of bulk structure 376, string 360 is a mirror image of string 362, and the first set of shunt switches $SH_0$–$SH_2^{[(n-1)/2]}{}_{-2}$ is a mirror image of the second set of shunt switches $SL_0$–$SL_2^{[(n-1)/2]}{}_{-2}$.

Digital potentiometer 450 operates in essentially the same way as digital potentiometer 350. Accordingly, the above discussion of the operation of digital potentiometer 350, and Examples 5 and 6 above, are applicable to digital potentiometer 450, and are incorporated herein by reference. A minor difference is that switching device 310 of digital potentiometer 450 is operable to bypass both bulk resistor $R_B$ 302 and dummy structure 378 when switching device 310 is on, and switching device 312 is operable to bypass both bulk resistor $R_B$ 304 and dummy structure 380 when switching device 312 is on. A BBM switching sequence may be used.

By comparison to digital potentiometer 350, having a respective one of bulk structures 374 and 376 coupled between each of the opposed ends of elemental resistor string 364, on the one hand, and strings 360 and 362, respectively, on the other, can provide improved linearity when switching between the lower and upper halves of the wiper address range. However, this improved performance is accomplished at least in part by the addition of two dummy structures 378, 380, thus increasing the component count.

Practitioners will appreciate that various alternative embodiments of the above-disclosed digital potentiometers are possible beyond the previously-discussed variation where the resistors are replaced with reactance devices or a combination of resistors and reactance devices. For instance, one alternative embodiment may combine the features of digital potentiometer 200 of FIG. 2 and digital potentiometer 350 of FIG. 4. In such an embodiment, the bulk resistor $R_B$ 202 and switching devices 208 and 210 of digital potentiometer 200 may be used in place of the pair of bulk resistors $R_B$ 302 and 304 and the associated switching devices 310 and 312 of digital potentiometer 350. As another example, in an alternative embodiment, the dummy structures 356 and 358 of digital potentiometer 350 of FIG. 4 may be added to digital potentiometer 300 of FIG. 3 to enhance the linearity of digital potentiometer 300 for particular applications. The dummy structure 356 may be disposed between string 204 and bulk resistor $R_B$ 302, or between bulk resistor $R_B$ 302 and terminal 310, and dummy structure 358 may be placed in a corresponding manner with respect to bulk resistor $R_B$ 304. Other embodiments are, of course, possible.

The digital potentiometers of the present invention may be fabricated on a single integrated circuit, either individually or in combination with other analog and digital functions (circuits), and packaged in an integrated circuit package. Standard implementations for resistors, switches and other circuits fabricated on the integrated circuit may be used. Various semiconductor technologies, such as N-channel and P-channel metal oxide semiconductor (NMOS and PMOS), complementary metal oxide semiconductor (CMOS), bipolar, biCMOS, junction field effect transistor (JFET), insulated gate field effect transistor (IGFET) and the like, may be used to implement the digital potentiometer and other circuits of the integrated circuit.

The terms "wiper switch," "shunt switch" and "switching device" are used broadly and are not limited to a particular structural form. For instance, switching device 310 may have the same structure as shunt switch $RH_0$.

The term "between" is used broadly. For instance, in FIG. 3, resistor $R_1$ of string 204 is between resistors $R_0$ and $R_2$, as well as between terminals 104 and 102.

The above-described embodiments are merely illustrative and not limiting. Various changes and modifications may be made to the exemplary embodiments herein without departing from the invention in its broader aspects.

We claim:

1. An n-bit digital potentiometer including $2^n$ wiper positions, comprising:
    a first reference terminal, an opposite second reference terminal, and a wiper terminal;
    a string of approximately same impedance elemental impedance devices, said string having first and second end terminals;
    a plurality of wiper switches each coupled between the wiper terminal and the first string; and
    a bulk impedance device having a first end coupled to the first end terminal of the first string, an opposite second end, and an impedance value greater than an impedance of the string of elemental impedance devices,
    wherein the string and the bulk impedance device are between the first and second reference terminals, and the second end terminal of the first string and the second end of the bulk impedance device are each switchable between a coupling to the first reference terminal and a coupling to the second reference terminal.

2. The digital potentiometer of claim 1, further comprising first and second switching devices operable to implement the switchable coupling of the first end terminal of the first string to the first and second reference terminals, and the switchable coupling of the second end of the bulk impedance device to the first and the second reference terminal, in a complementary manner,
    wherein the first switching device is coupled between the first end terminal of the first string, the first reference terminal, and the second reference terminal, and the second switching device is coupled between the second end of the bulk impedance device, the first reference terminal, and the second reference terminal.

3. The digital potentiometer of claim 2, wherein first switching device includes a first transistor coupled between the first end terminal of the first string and the first reference terminal, and a second transistor coupled between the first end terminal of the first string and the second reference terminal, and
    wherein the second switching device includes a first transistor coupled between the second end of the bulk impedance device and the second reference terminal, and a second transistor coupled between the second end of the bulk impedance device and the first reference terminal.

4. The digital potentiometer of claim 2, wherein the first and second switching devices are controlled based on a most significant bit of an input n-bit wiper address.

5. The digital potentiometer of claim 1, wherein the switchable coupling of the first end terminal of the first string and the second end of the bulk impedance device are controlled in a complementary manner based on a most significant bit of an input n-bit wiper address.

6. The digital potentiometer of claim 5, wherein a switching of the wiper switches is controlled based on bits of the input n-bit wiper address other than the most significant bit of the wiper address.

7. The digital potentiometer of claim 1, wherein the impedance of the bulk impedance device is approximately $2^{n-1}$ times the impedance of one of the elemental impedance devices.

8. The digital potentiometer of claim 7 wherein the digital potentiometer has $2^{n-1}-1$ said elemental impedance devices, and $2^{n-1}$ said wiper switches.

9. The digital potentiometer of claim 1, wherein the impedance of the first string is less than the impedance of the bulk impedance device by an amount approximately equal to the impedance of one of the elemental impedance devices.

10. The digital potentiometer of claim 1 wherein the digital potentiometer has $2^{n-1}-1$ said elemental impedance devices, $2^{n-1}$ said wiper switches, the impedance of the bulk impedance device is approximately $2^{n-1}$ times the impedance of one of the elemental impedance devices, and the complementary switching of the first end terminal of the first string and the second end of the bulk impedance device is controlled based on a most significant bit of an input n-bit wiper address.

11. An n-bit digital potentiometer including $2^n$ wiper positions, comprising:
    a first reference terminal, an opposite second reference terminal, and a wiper terminal;
    a string of $2^{n-1}-1$ approximately same impedance elemental impedance devices, wherein a first end of the string is coupled to the wiper terminal;
    a plurality of wiper switches each coupled between the wiper terminal and the string; and
    at least one bulk impedance device, wherein the at least one bulk impedance device has an impedance approximately $2^{n-1}$ times the impedance of one of the elemental impedance devices, and the string and the at least one bulk impedance device are disposed between the first and second reference terminals.

12. The digital potentiometer of claim 11, further comprising at least one switching device, wherein operation of the at least one switching device causes the string to alternate between providing wiper positions in a lower half of the $2^n$ wiper positions and in an upper half of the $2^n$ wiper positions.

13. The digital potentiometer of claim 12, wherein the at least one bulk impedance device is a single bulk impedance device, and the single bulk impedance device is coupled to the first end of the string.

14. The digital potentiometer of claim 12 wherein the string has a second end opposite the first end, the at least one switching device is two switching devices, with one of the two switching devices coupled between the second end of the string and the first reference terminal, and the other of the two switching devices coupled between the single bulk impedance device and the second reference terminal.

15. The digital potentiometer of claim 12, wherein the string alternates between providing wiper positions in a lower half of the $2^n$ wiper positions and in an upper half of the $2^n$ wiper positions during operation of the digital potentiometer.

16. The digital potentiometer of claim 11, wherein the at least one bulk impedance device is first and second bulk impedance devices, the at least one switching device is first and second switching devices, and the string includes a second end opposite the first end, and
   wherein the first bulk impedance device and the first switching device are coupled to the first end of the string and the first reference terminal, with the first switching device being operable to bypass the first bulk impedance device, and the second bulk impedance device and the second switching device are coupled to the second end of the string and the second reference terminal, with the second switching device being operable to bypass the second bulk impedance device.

17. The digital potentiometer of claim 16, wherein the first and second switching devices are operable in a complementary manner based on a most significant bit of an input n-bit wiper address.

18. The digital potentiometer of claim 12, wherein the at least one bulk impedance device is first and second bulk impedance devices, the at least one switching device is first and second switching devices, the first switching device is operable to bypass the first bulk impedance device, and the second switching device is operable to bypass the second bulk impedance device.

19. The digital potentiometer of claim 18, wherein the first and second switching devices are operable in a complementary manner based on a most significant bit of an input n-bit wiper address.

20. An n-bit digital potentiometer including $2^n$ wiper positions, comprising:
   a first reference terminal, an opposite second reference terminal, and a wiper terminal;
   a string of approximately same impedance elemental impedance devices;
   at least one bulk impedance device, wherein the string and the at least one bulk impedance device are disposed between the first and second reference terminals, and the at least one bulk impedance device has an impedance greater than an impedance of the string;
   a plurality of wiper switches each coupled between the wiper terminal and the string; and
   a control circuit that receives an input n-bit wiper address, and based thereon controls both a switching of the wiper switches and a selection between having the string provide wiper positions in a lower half of the $2^n$ wiper positions and in an upper half of the $2^n$ wiper positions.

21. The digital potentiometer of claim 20, wherein the control circuit selects between having the string provide wiper positions in the lower half of the $2^n$ wiper positions and in the upper half of the $2^n$ wiper positions based on a first subportion of the input n-bit wiper address, and controls the switching of the wiper switches based on a different second subportion of the n-bit wiper address.

22. The digital potentiometer of claim 20, wherein the at least one bulk impedance device is a single bulk impedance device.

23. The digital potentiometer of claim 19, wherein the at least one bulk impedance device is a first bulk impedance device and a second bulk impedance device, with the first bulk impedance device being coupled between a first end of the string and the first reference terminal, and the second bulk impedance device being coupled between an opposite second end of the string and the second reference terminal, and
   wherein the control circuit controls a selective bypassing of the first bulk impedance device, and a selective bypassing of the second bulk impedance device.

24. A method of operating an n-bit digital potentiometer having $2^n$ impedance units between a first reference terminal and a second reference terminal, the method comprising:
   disposing an n-bit wiper address in the digital potentiometer, said digital potentiometer including a first string of elemental impedance and a bulk impedance device between the first and second reference terminals, the bulk impedance device having an impedance greater than an impedance of the first string, wherein a first end of the string is coupled to a first end of the bulk impedance device;
   alternating a coupling of the second end of the first string and the second end of the bulk impedance device to the first reference terminal and to the second reference terminal based on the first n-bit wiper address; and
   tapping the first string based on the first n-bit wiper address.

25. The method of claim 24, wherein the step of alternating the coupling is based on only a most significant bit of the n-bit wiper address.

26. The method of claim 24, wherein the digital potentiometer has $2^{n-1}-1$ said elemental impedance devices, and an impedance of the bulk impedance device is approximately $2^{n-1}$ times the impedance of one of the elemental impedance devices.

27. A method of operating an n-bit digital potentiometer having $2^n$ wiper positions, a first reference terminal and a second reference terminal, the method comprising:
   disposing an n-bit wiper address in the digital potentiometer, said digital potentiometer including a first string of $2^{n-1}-1$ approximately same impedance elemental impedance devices and at least one bulk impedance between the first and second reference terminals, the at least one bulk impedance device having an impedance approximately $2^{n-1}$ times the impedance of one of the elemental impedance devices;
   alternating the first string between providing impedance in a lower half of the $2^n$ wiper positions and an upper half of the $2^n$ wiper positions based on a first subportion of the n-bit wiper address, with the at least one bulk impedance device providing impedance in the one of the lower half and the upper half of the $2^n$ wiper positions not provided by the first string; and
   tapping the first string based on a second subportion of the n-bit wiper address.

28. The method of claim 27, wherein the at least one bulk impedance device is a single bulk impedance device, and the step of alternating the first string comprises:
   coupling the first string to the first reference terminal to have the first string provide impedance in the lower half of the $2^n$ wiper positions and to the second reference terminal to provide impedance in the upper half of the $2^n$ wiper positions, and coupling the single bulk impedance device to the one of the first and second reference terminals not coupled to the first string.

29. The method of claim 28, wherein a first structure also is between the first and second reference terminals, said first structure comprising an impedance device and a permanently-on switch.

30. The method of claim 27, wherein the at least one bulk impedance device comprises two bulk impedance devices, with one of the bulk impedance devices being coupled between the first reference terminal and a first end of the first string and the other of the bulk impedance devices being coupled between the second reference terminal and a second end of the first string, and wherein the step of alternating the first string comprises bypassing one of the bulk impedance devices and not bypassing the other of the bulk impedance devices.

31. The method of claim 30, wherein a first structure also is between the first and second reference terminals, said first structure comprising an impedance device and a permanently-on switch.

32. The method of claim 27, wherein a first structure also is between the first and second reference terminals, said first structure comprising an impedance device and a permanently-on switch.

33. An n-bit digital potentiometer including $2^n$ wiper positions, comprising:

a first reference terminal, an opposite second reference terminal, and an wiper terminal;

a first string of approximately same impedance elemental impedance devices, said first string having opposed first and second end terminals;

a plurality of wiper switches each coupled between the wiper terminal and the first string; and at least one bulk impedance device having an impedance greater than an impedance of the first string, wherein the first string and the at least one bulk impedance device are disposed between the first and second reference terminals, and wherein the at least one bulk impedance device is coupled between the first reference terminal and the first string when an input n-bit wiper address has a logical one most significant bit and is coupled between the second reference terminal and the first string when the most significant bit of the input n-bit wiper address is a logical zero.

34. The digital potentiometer of claim 33, wherein the at least one bulk impedance device is a single bulk impedance device selectively coupleable to the first and second reference terminals.

35. The digital potentiometer of claim 33, wherein the at least one bulk impedance device comprises first and second bulk impedance devices, with the first bulk impedance device being coupled between the first reference terminal and the first end terminal of the first string, and the second bulk impedance device being coupled between the second reference terminal and the second end terminal of the first string, and wherein a first switching device is coupled to the first reference terminal, and second switching device is coupled to the second reference terminal, the first switching device being operable to bypass the first bulk impedance device, and the second switching device being operable to bypass the second bulk impedance device.

36. The digital potentiometer of claim 33, further comprising mirror image second and third strings of shunted impedance devices also between the first and second reference terminals, wherein an impedance of each of the second and third strings is between the impedance of the first string and the impedance of the at least one bulk resistor.

* * * * *